United States Patent
Fukuzumi et al.

(10) Patent No.: US 9,190,167 B2
(45) Date of Patent: Nov. 17, 2015

(54) SHIFT REGISTER AND SHIFT REGISTER TYPE MAGNETIC MEMORY

(71) Applicant: Kabushiki Kaisha Toshiba, Minato-ku (JP)

(72) Inventors: Yoshiaki Fukuzumi, Yokohama (JP); Hideaki Aochi, Kawasaki (JP); Hirofumi Morise, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 320 days.

(21) Appl. No.: 13/935,763

(22) Filed: Jul. 5, 2013

(65) Prior Publication Data

US 2014/0241030 A1    Aug. 28, 2014

Related U.S. Application Data

(60) Provisional application No. 61/770,539, filed on Feb. 28, 2013.

(51) Int. Cl.
   G11C 19/00    (2006.01)
   G11C 19/02    (2006.01)
   G11C 19/08    (2006.01)

(52) U.S. Cl.
   CPC .............. *G11C 19/02* (2013.01); *G11C 19/08* (2013.01)

(58) Field of Classification Search
   CPC .................................................. G11C 11/19
   USPC ......... 365/48, 55, 62, 66, 74, 78, 80–93, 100, 365/130, 131, 148, 158, 171–173, 225.5, 365/243.5; 257/421, E21.665; 438/3; 977/933–935
   See application file for complete search history.

(56) References Cited

U.S. PATENT DOCUMENTS 6,104,632 A    8/2000    Nishimura
6,667,526 B2   12/2003   Komori
(Continued)

FOREIGN PATENT DOCUMENTS

JP    2000-76844     3/2000
JP    2002-299727   10/2002
(Continued)

OTHER PUBLICATIONS

U.S. Appl. No. 13/857,672, filed Apr. 5, 2013, Yoshiaki Fukuzumi et al.

*Primary Examiner* — Harry W Byrne
(74) *Attorney, Agent, or Firm* — Oblon, McClelland, Maier & Neustadt, L.L.P.

(57) ABSTRACT

A shift register according to an embodiment includes: a magnetic nanowire; a first control electrode group and a second control electrode group arranged with the magnetic nanowire being sandwiched therebetween, the first control electrode group including a plurality of first control electrodes arranged to be spaced apart from each other along a direction in which the magnetic nanowire extends, the second control electrode group including a plurality of second control electrodes arranged to be spaced apart from each other to correspond to the plurality of first control electrodes along the direction in which the magnetic nanowire extends, and the second control electrodes corresponding to the first control electrodes being shifted in the direction in which the magnetic nanowire extends; a first driving unit for driving the first control electrode group; and a second driving unit for driving the second control electrode group.

20 Claims, 18 Drawing Sheets

(56) References Cited

U.S. PATENT DOCUMENTS

| | | | |
|---|---|---|---|
| 6,829,121 B2 | 12/2004 | Ikeda et al. | |
| 6,834,005 B1 * | 12/2004 | Parkin | 365/80 |
| 6,898,132 B2 * | 5/2005 | Parkin | 365/189.12 |
| 6,920,062 B2 | 7/2005 | Parkin | |
| 7,031,178 B2 * | 4/2006 | Parkin | 365/80 |
| 7,236,386 B2 * | 6/2007 | Parkin | 365/80 |
| 7,492,622 B2 * | 2/2009 | Parkin et al. | 365/80 |
| 7,551,469 B1 * | 6/2009 | Parkin | 365/80 |
| 7,626,844 B1 * | 12/2009 | Moriya et al. | 365/80 |
| 7,667,994 B1 * | 2/2010 | Moriya et al. | 365/81 |
| 7,760,535 B2 * | 7/2010 | Parkin et al. | 365/81 |
| 7,916,521 B2 | 3/2011 | Kajiyama | |
| 8,437,167 B2 | 5/2013 | Fukuzumi et al. | |
| 2002/0182442 A1 | 12/2002 | Ikeda et al. | |
| 2003/0107057 A1 | 6/2003 | Komori | |
| 2004/0252538 A1 * | 12/2004 | Parkin | 365/80 |
| 2004/0252539 A1 * | 12/2004 | Parkin | 365/80 |
| 2005/0094427 A1 * | 5/2005 | Parkin | 365/80 |
| 2006/0120132 A1 * | 6/2006 | Parkin | 365/80 |
| 2008/0165454 A1 | 7/2008 | Kajiyama | |
| 2008/0253161 A1 * | 10/2008 | Parkin et al. | 365/80 |
| 2009/0103347 A1 * | 4/2009 | Parkin et al. | 365/80 |
| 2010/0046268 A1 * | 2/2010 | Moriya et al. | 365/80 |
| 2011/0267868 A1 | 11/2011 | Fukuzumi et al. | |
| 2012/0250406 A1 | 10/2012 | Morise et al. | |
| 2013/0020627 A1 | 1/2013 | Fukuzumi et al. | |
| 2013/0242634 A1 | 9/2013 | Fukuzumi et al. | |
| 2013/0242670 A1 | 9/2013 | Hattori et al. | |
| 2013/0250668 A1 | 9/2013 | Fukuzawa et al. | |
| 2013/0294138 A1 | 11/2013 | Fukuzumi et al. | |

FOREIGN PATENT DOCUMENTS

| | | |
|---|---|---|
| JP | 2003-174149 | 6/2003 |
| JP | 2006-237183 | 9/2006 |
| JP | 2008-159613 | 7/2008 |
| JP | 2011-233206 A | 11/2011 |
| JP | 2012-501037 | 1/2012 |
| JP | 2012-514853 | 6/2012 |
| JP | 2012-212715 A | 11/2012 |
| JP | 2013-26397 A | 2/2013 |
| JP | 2013-191692 A | 9/2013 |
| JP | 2013-197269 A | 9/2013 |
| JP | 2013-201174 A | 10/2013 |

* cited by examiner (a) DETECTION USING TMR (b) DETECTION USING INDUCED ELECTROMOTIVE FORCE (c) DETECTION USING SPIN WAVE

SHIFT REGISTER AND SHIFT REGISTER TYPE MAGNETIC MEMORY

CROSS REFERENCE TO RELATED APPLICATIONS

This application is based upon and claims the benefit of priority from the prior provisional Application 61/770,539 filed on Feb. 28, 2013 in USA, the entire contents of which are incorporated herein by reference.

FIELD

The embodiments described herein relate to shift registers and shift register magnetic memories.

BACKGROUND

As a method of achieving a large capacity memory, a shift register type magnetic memory is proposed. Unlike a conventional semiconductor memory in which each memory cell includes a storage element, a selection element, and wiring for obtaining information, the shift register type magnetic memory transfers stored information to the locations of a sensor and wiring.

In shift register memories that have been proposed, the shift operation has been performed by using a current pulse flowing through a shift register. However, it is not easy to shift information of all the digits using a current pulse without fail. In particular, in a case where information of 100 digits or more is dealt with in order to achieve a large capacity memory, the physical length of the shift register increases, resulting in that the possibility of the occurrence of malfunction increases due to the unsharpening of current pulse waveform caused by the capacitance or inductance component.

In order to drive a magnetic domain by current pulse, a large current density of about $1 \times 10^7$ A/cm$^2$ is required. In particular, in a case of a shift register with 100 digits or more, the length of magnetic nanowire increases, thereby increasing the resistance value. As a result, a high voltage is required to generate current pulses. There is a fear in that this would prevent the memories from having a large capacity.

DETAILED DESCRIPTION

A shift register type magnetic memory according to an embodiment includes: at least one magnetic nanowire; a first control electrode group and a second control electrode group arranged with the magnetic nanowire being sandwiched therebetween, the first control electrode group including a plurality of first control electrodes arranged to be spaced apart from each other along a direction in which the magnetic nanowire extends, the second control electrode group including a plurality of second control electrodes arranged to be spaced apart from each other to correspond to the plurality of first control electrodes along the direction in which the magnetic nanowire extends, and the second control electrodes corresponding to the first control electrodes being shifted in the direction in which the magnetic nanowire extends; a first driving unit for driving the first control electrode group; and a second driving unit for driving the second control electrode group, the first driving unit and the second driving unit alternately applying voltage.

Embodiments will now be explained with reference to the accompanying drawings.

First Embodiment

Figure 1:
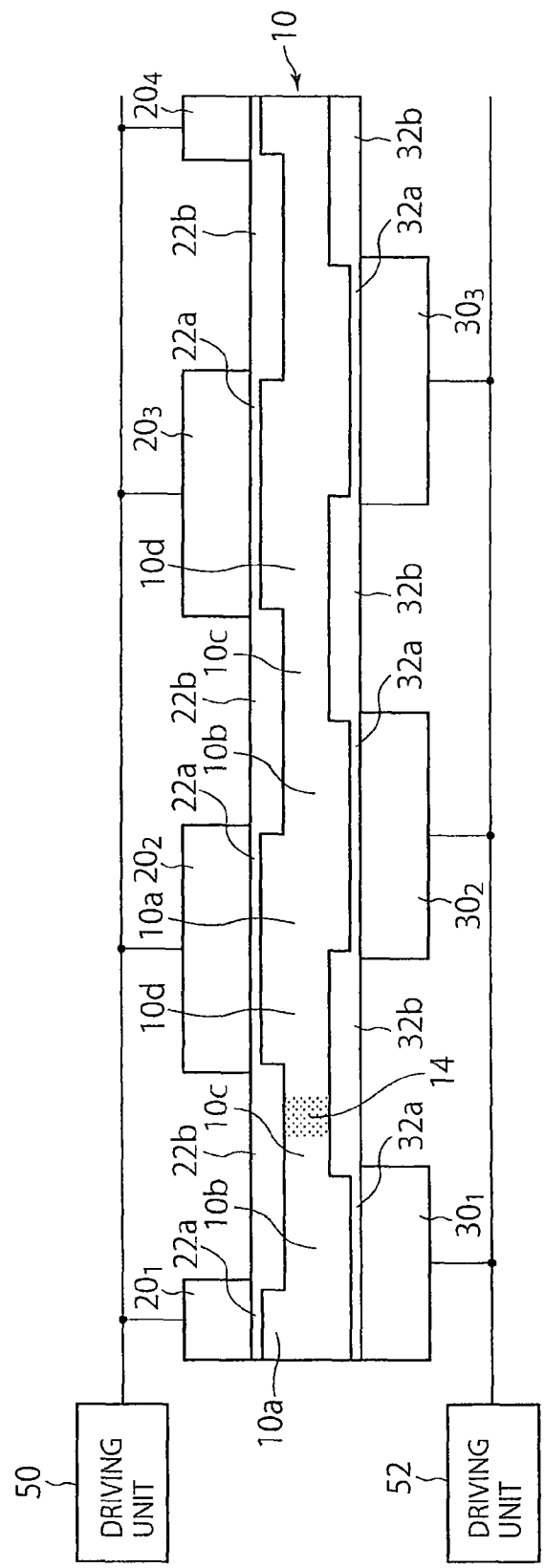
FIG. 1 is a top view showing a shift register type magnetic memory according to a first embodiment.

FIG. 1 is a top view of a magnetic memory according to a first embodiment, which includes a magnetic nanowire 10 having a pair of first surface and second surface opposite to each other, a plurality of first control electrodes $20_i$ (i=1, . . . ) provided onto the first surface of the magnetic nanowire 10 and spaced apart from each other along a direction in which the magnetic nanowire 10 extends, an insulating film 22a provided between each of the first control electrodes $20_i$ (i=1, . . . ) and the magnetic nanowire 10, an insulating film 22b provided onto the first surface between two adjacent first control electrodes $20_i$, $20_{i+1}$ (i=1, . . . ), a plurality of second control electrodes $30_i$ (i=1, . . . ) provided onto the second surface of the magnetic nanowire 10 and spaced apart from each other along the direction in which the magnetic nanowire 10 extends, an insulating film 32a provided between each of the second control electrodes $30_i$ (i=1, . . . ) and the magnetic nanowire 10, an insulating film 32b provided onto the second surface between two adjacent second control electrodes $30_i$, $30_{i+1}$ (i=1, ... ), a driving unit 50 for driving the first control electrodes $20_i$ (i=1, ... ), and a driving unit 52 for driving the second control electrodes $30_i$ (i=1, 2, ... ). Incidentally, FIG. 1 shows a shift register unit of the magnetic memory according to the first embodiment.

The magnetic nanowire 10 includes four regions, i.e., a region 10a having both a first control electrode $20_i$ (i=1, ... ) and a second control electrode $30_i$ (i=1, 2, ... ), a region 10b having a second control electrode $30_i$ (i=1, 2, ... ) of the first control electrode $20_i$ (i=1, ... ) and the second control electrode $30_i$ (i=1, 2, ... ), a region 10c having none of first control electrode $20_i$ (i=1, ... ) and second control electrode $30_i$ (i=1, 2, ... ), and a region 10d having a first control electrode $20_i$ (i=1, ... ) of the first control electrode $20_i$ (i=1, ... ) and the second control electrode $30_i$ (i=1, 2, ... ), the region 10a, the region 10b, the region 10c, and the region 10d being arranged in this order along the direction in which the magnetic nanowire 10 extends. That is, the first control electrodes $20_i$ (i=1, ... ) and the second control electrodes $30_i$ (i=1, ... ) arranged to be relatively shifted from each other with the magnetic nanowire 10 being sandwiched therebetween, so that there are portions each having both a first control electrode $20_i$ (i=1, ... ) and a second control electrode $30_i$ (i=1, ... ) and portions each not having both of the first control electrode $20_i$ (i=1, ... ) and the second control electrode $30_i$ (i=1, ... ). For example, if the distance between two adjacent first control electrodes $20_i$ and $20_{i+1}$ (i=1, ... ) arranged along the direction in which the magnetic nanowire 10 extends, i.e., the pitch of the two adjacent first control electrodes, and the pitch of two adjacent second control electrodes are the same, and if the length of the first and second control electrodes in the direction in which the magnetic nanowire 10 extends is ½ of the pitch of the first control electrodes, the second control electrodes should be arranged so as to be shifted from the first control electrodes by ¼ pitch of the first control electrodes. Incidentally, in this specification, the magnetic nanowire 10 is, for example, a magnetic film having a thickness of 1 nm to 10 nm and a width of 10 nm to 40 nm.

The insulating film 22b is thicker than the insulating film 22a, and embedded in the magnetic nanowire 10. Similarly, the insulating film 32b is thicker than the insulating film 32a, and embedded in the magnetic nanowire 10. As a result, the width of the magnetic nanowire 10 (the length in the vertical direction in FIG. 1) is the widest in the region 10a, wider in the regions 10b and 10d, and the narrowest in the region 10c.

A voltage is applied by the driving unit 50 to the first control electrodes $20_i$ (i=1, ... ), and a voltage is applied by the driving unit 52 to the second control electrodes $30_i$ (i=1, ... ). It is preferable that the first control electrodes $20_i$ (i=1, ... ) be connected with each other by a wire etc., and collectively controlled. It is also preferable that the second control electrodes $30_i$ (i=1, ... ) be connected with each other by a wire etc., and collectively controlled.

Next, the shift operation of the magnetic memory according to the first embodiment, i.e., a method of moving the magnetic domain wall, will be described with reference to FIGS. 2(a) to 3(c).

First, at the time $t_0$, the potentials of the magnetic nanowire 10, the first control electrodes $20_i$ (i=1, ... ), and the second control electrodes $30_i$ (i=1, ... ) are fixed to the same potential, for example, 0 V. At this time, if a magnetic domain 13 is formed in the magnetic nanowire 10 as shown in FIG. 2(a), magnetic domain walls 14 corresponding to boundary portions thereof are stable in the regions 10c of the magnetic nanowire 10, in which none of the first control electrode $20_i$ (i=1, ... ) and the second control electrode $30_i$ (i=1, ... ) is formed, since the energy of the boundary portions becomes the lowest in a region where the magnetic nanowire 10 has the narrowest width.

Figure 2:
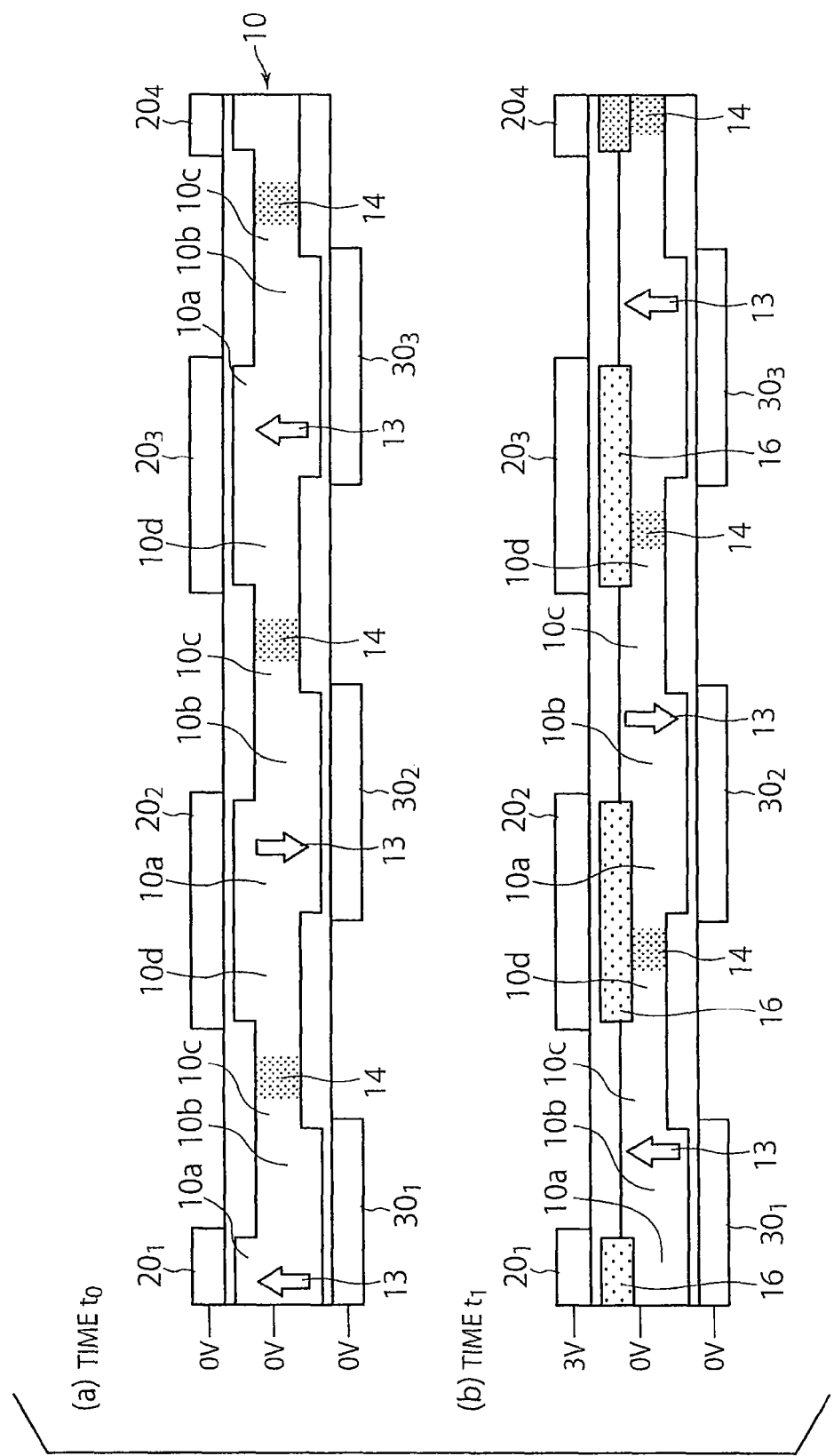
FIGS. 2(a) and 2(b) are drawings for explaining the shift operation of the shift register type magnetic memory according to the first embodiment.
Figure 3:
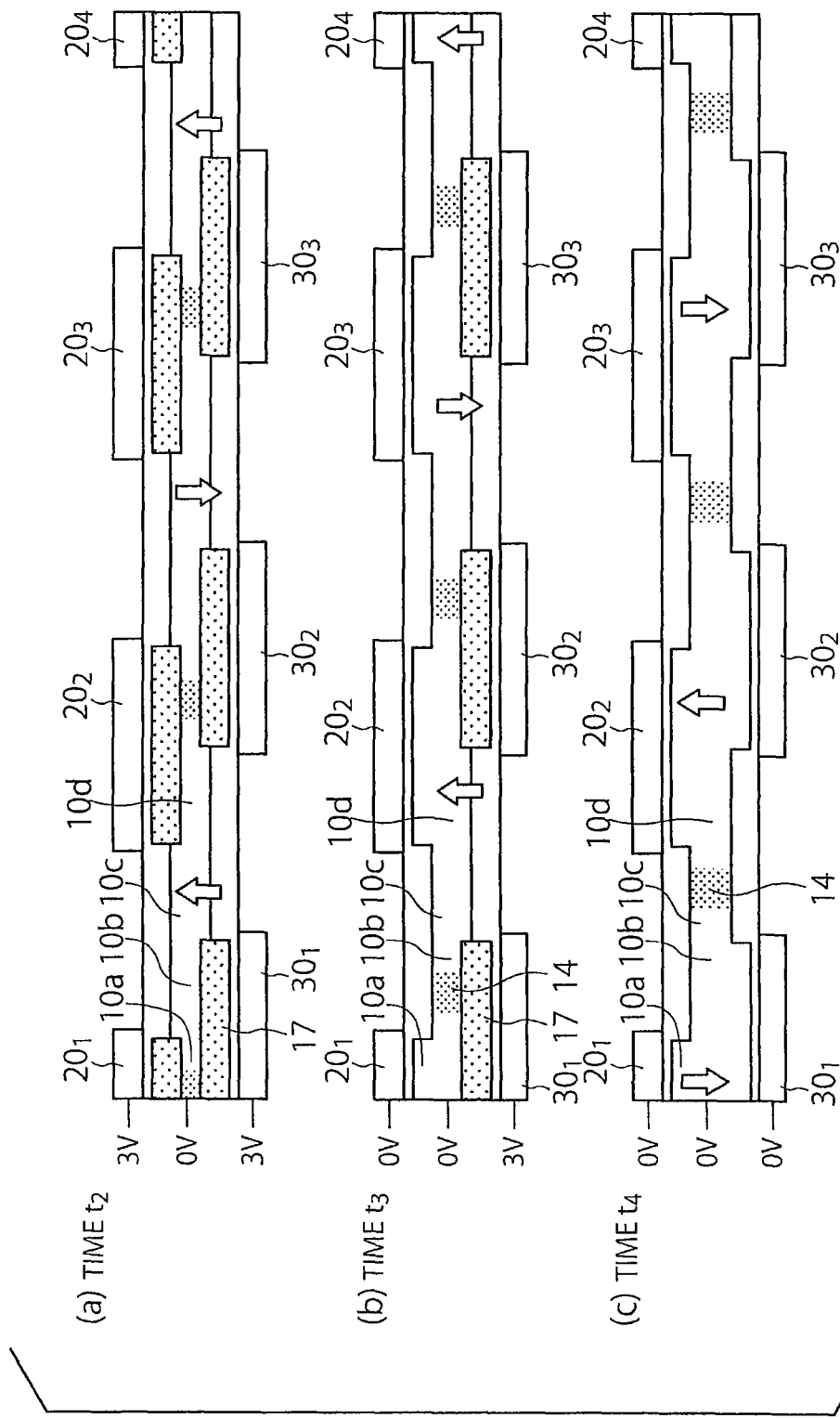
FIGS. 3(a) to 3(c) are drawings for explaining the shift operation of the shift register type magnetic memory according to the first embodiment.

At the time $t_1$, a voltage of, for example, 3 V is applied to the first control electrodes $20_i$ (i=1, ... ) as shown in FIG. 2 (b). As a result, an electric field is generated between the magnetic nanowire 10 and each first control electrode $20_i$ (i=1, ... ), thereby changing the magnetic anisotropy in a region 16 of the magnetic nanowire 10 around the interface with the insulating film 22a. For the convenience of explanation, in FIG. 2 (b), the magnetic anisotropy of the region 16 is zero. In such a case, the magnetic width of the magnetic nanowire 10 is the narrowest in the region 10d where only the first control electrode $20_i$ (i=1, ... ) exists, and each magnetic domain wall 14 moves from a region 10c to a region 10d, and becomes stable.

Next, as shown in FIG. 3(a), at the time $t_2$, a voltage, i.e., 3 V, is applied to the second control electrodes $30_i$ (i=1, ... ), thereby changing the magnetic anisotropy in a region 17 of the magnetic nanowire 10 around the interface between the magnetic nanowire 10 and a second control electrode $30_i$ (i=1, ... ). In this case, the magnetic width of the magnetic nanowire 10 is the narrowest in the region 10a where both the first control electrode $20_i$ (i=1, ... ) and the second control electrode $30_i$ (i=1, ... ) exist, and each magnetic domain wall 14 moves from a region 10d to a region 10a, and becomes stable in terms of energy.

Then, as shown in FIG. 3(b), at the time $t_3$, the voltage applied to the first control electrode $20_i$ (i=1, ... ) is changed to 0 V again. As a result, the magnetic anisotropy of the magnetic nanowire 10 in a region near the first control electrode $20_i$ (i=1, ... ) is recovered, and the magnetic nanowire width becomes the narrowest in the region 10b where only the second control electrode $30_i$ (i=1, ... ) exists. Each magnetic domain wall 14 moves from a region 10a to a region 10b, and becomes stable in terms of energy.

Thereafter, as shown in FIG. 3(c), at the time $t_4$, the voltage applied to the second control electrodes $30_i$ (i=1, ... ) is also changed to 0 V again. As a result, the magnetic width of the magnetic nanowire 10(b) becomes the narrowest in the region 10c where none of the first and the second control electrodes exists, and each magnetic domain wall 14 moves from a region 10b to a region 10c, and becomes stable.

As a result of the above cycle, each magnetic domain wall 14 corresponding to the boundary of magnetization information (the direction of the magnetization in the magnetic domain) is shifted right in the drawings by one cycle including a first control electrode and a second control electrode. In the above explanation, after a voltage is applied to the first control electrodes $20_i$ (i=1, ... ), a voltage is applied to the second control electrodes $30_i$ (i=1, ... ). If the order of applying voltage is reversed so that after a voltage is applied to the second control electrodes $30_i$ (i=1, ... ), a voltage is applied to the first control electrodes $20_i$ (i=1, ... ), it is possible to shift the magnetic domain wall 14 left. Thus, it is possible to shift the magnetization information in a desired direction by applying a voltage to the first control electrodes $20_i$ (i=1, ... ) and the second control electrodes $30_i$ (i=1, ... ), which are short-circuited.

Next, the writing and the reading of magnetization information to and from the magnetic memory according to the first embodiment will be described.

The writing of information to the magnetic nanowire 10 is performed by a writing unit provided to be close to the magnetic nanowire 10. A first specific example of the writing unit is shown in FIGS. 4(a) and 4(b).

(Writing Unit)

Figure 4:
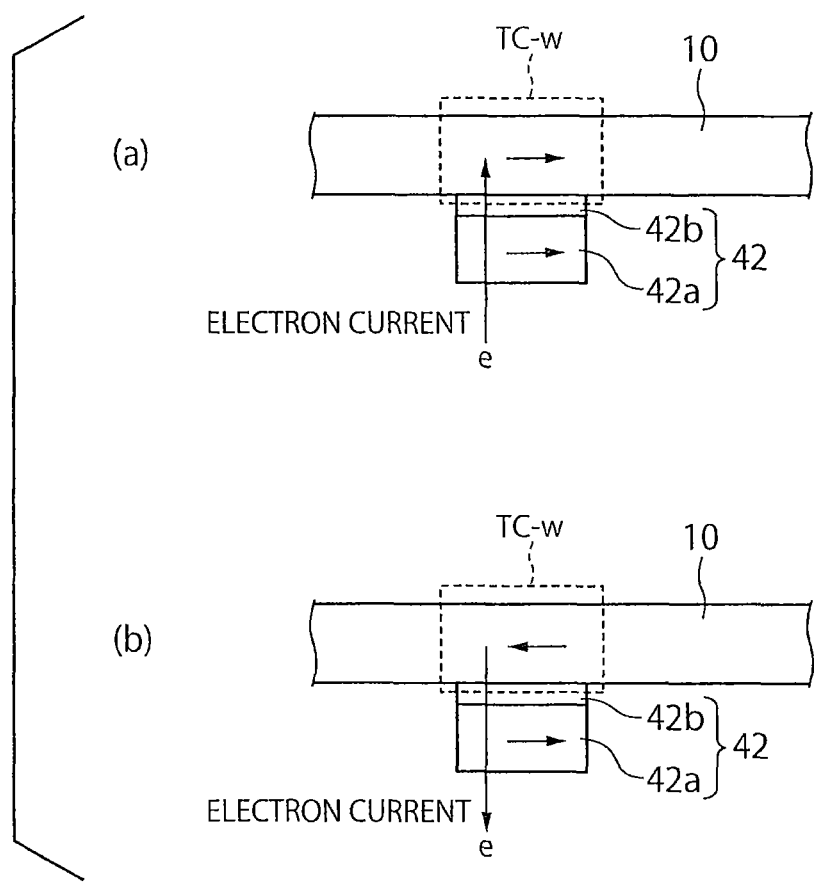
FIGS. 4(a) and 4(b) are drawings showing a first specific example of a writing unit.

As shown in FIGS. 4(a) and 4(b), a writing unit 42 is provided to a part of the magnetic nanowire 10. The writing unit 42 writes data to a target cell (cell having an address, which is the target of the writing operation: TC-w) of the magnetic nanowire 10 by fixing the direction of magnetization. For example, spin torque writing can be used in the writing unit 42, as shown in FIGS. 4(a) and 4(b). In FIGS. 4(a) and 4(b), a magnetic electrode 42a is provided so as to be in contact with the magnetic nanowire 10 via an intermediate layer 42b. The intermediate layer 42b is formed of a nonmagnetic metal layer, nonmagnetic semiconductor layer, or tunnel barrier layer.

The direction of magnetization of the magnetic electrode 42a is fixed, and is parallel to the film plane of the intermediate layer 42b. Incidentally, "film plane" means the interface between the intermediate layer 42b and the magnetic electrode 42a, which is parallel to the direction in which the magnetic nanowire 10 extends. In the write operation, an electron current (which flow in the direction opposite to the direction of the corresponding electric current) is caused to flow between the magnetic nanowire 10 and the magnetic electrode 42a, and depending on the direction of this electron current, the direction of magnetization of the target cell TC-w is fixed, thereby writing data thereto. FIG. 4(a) shows a case where the write operation is performed so that the direction of magnetization of the target cell TC-w is parallel with the direction of magnetization of the magnetic electrode 42a. In this case, an electron current is caused to flow from the magnetic electrode 42a to the target cell TC-w of the magnetic nanowire 10 via the intermediate layer 42b. FIG. 4(b) shows a case where the write operation is performed so that the direction of magnetization of the target cell TC-w is antiparallel to the direction of magnetization of the magnetic electrode 42a. In this case, an electron current is caused to flow from the target cell TC-w of the magnetic nanowire 10 to the magnetic electrode 42a via the intermediate layer 42b. When the intermediate layer 42b is a tunnel barrier layer, the writing unit 42 shown in FIGS. 4(a) and 4(b) becomes an MTJ (Magnetic Tunneling Junction) element having the magnetic nanowire 10 as a free layer.

Examples of the material of the nonmagnetic metal layer serving as the intermediate layer 42b of the writing unit 42 are Cu, Ag, Au, Al, and an alloy containing at least one of the above materials. Examples of the material of the tunnel barrier layer are aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, $Cr_2O_3$, and so on. An example of the material of the intermediate layer 42b is a nonmagnetic material such as graphite.

The same material as that of the magnetic nanowire 10 can be used to form the magnetic electrode 42a of the writing unit 42.

As described above, the write operation can be performed by means of the writing unit 42. It is possible to write magnetization information to the whole of the magnetic nanowire by repeating such a process that the write operation for writing the magnetization is performed on a certain bit, thereafter a voltage is applied to the first control electrodes $20_i$ (i= 1, . . . ) and the second control electrodes $30_i$ (i=1, . . . ) by means of the driving units 50, 52, thereby shifting the magnetization information throughout the magnetic nanowire 10 by a desired distance, and then the next bit information is written.

Although the direction of magnetization of the magnetic nanowire 10 is parallel to the direction in which the magnetic nanowire 10 extends in FIGS. 4(a) and 4(b), the direction of magnetization can be perpendicular to the direction in which the magnetic nanowire 10 extends. In this case, the magnetization of the magnetic electrode 42a shown in FIGS. 4(a) and 4(b) is perpendicular to the film plane.

(Reading Unit)

The reading of information from the magnetic nanowire 10 is performed by a reading unit provided close to the magnetic nanowire 10. FIGS. 5(a), 5(b), and 5(c) show first to third specific examples of the reading unit, respectively.

As shown in FIG. 5(a), in a reading unit 44, the direction of magnetization of the target cell TC-w, which has been moved to a corresponding position of the magnetic nanowire 10, is read. The reading unit 44 may have a structure for reading a signal using a tunneling magnetoresistive effect by providing a magnetic electrode 44a that is in contact with the magnetic nanowire 10 via a tunnel barrier layer 44b, as shown in, for example, FIG. 5(a). Examples of the material of the tunnel barrier layer 44b are aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, $Cr_2O_3$, and so on. The same material as that of the magnetic nanowire 10 can be used to form the magnetic electrode 44a. The reading unit 44 shown in FIG. 5(a) can be an MTJ element having the magnetic nanowire 10 as a free layer.

Figure 5:
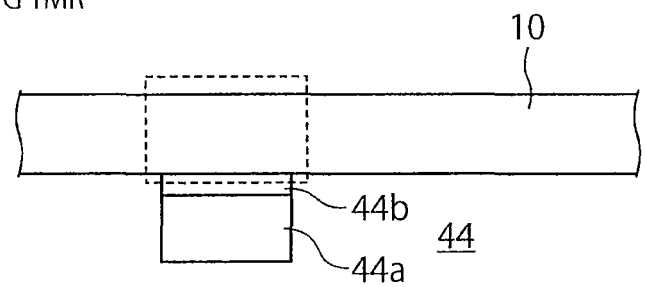
FIGS. 5(a) to 5(c) are drawings showing first to third examples of a reading unit.
Figure 5:
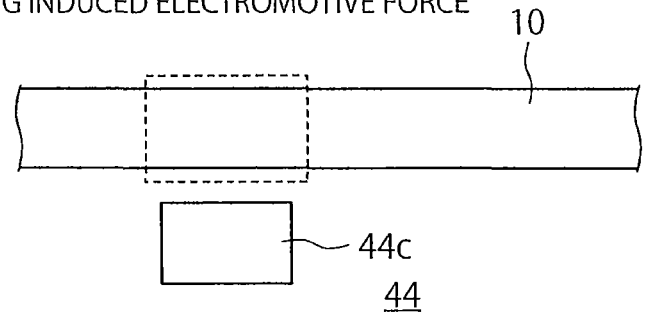
Figure 5:
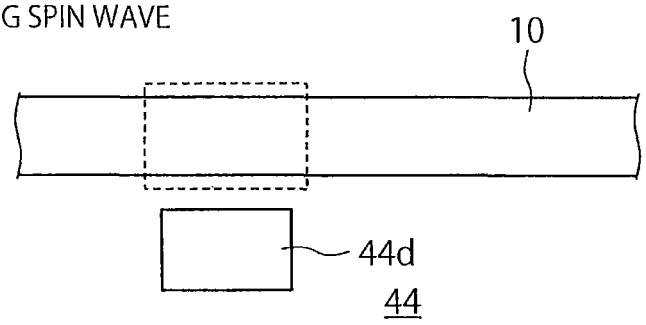
Figure 6:
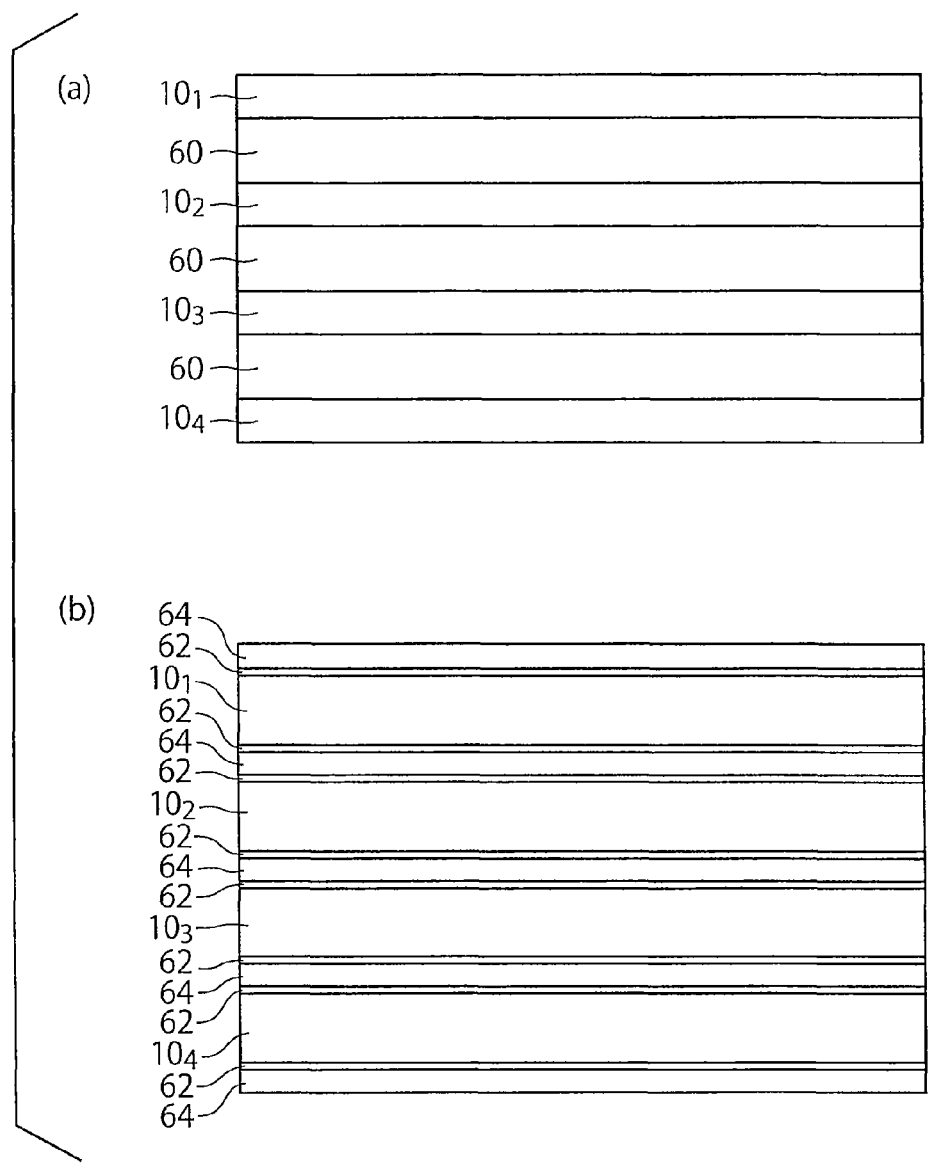
FIGS. 6(a) and 6(b) are plan views showing a process of manufacturing the magnetic memory according to the first embodiment.
Figure 7:
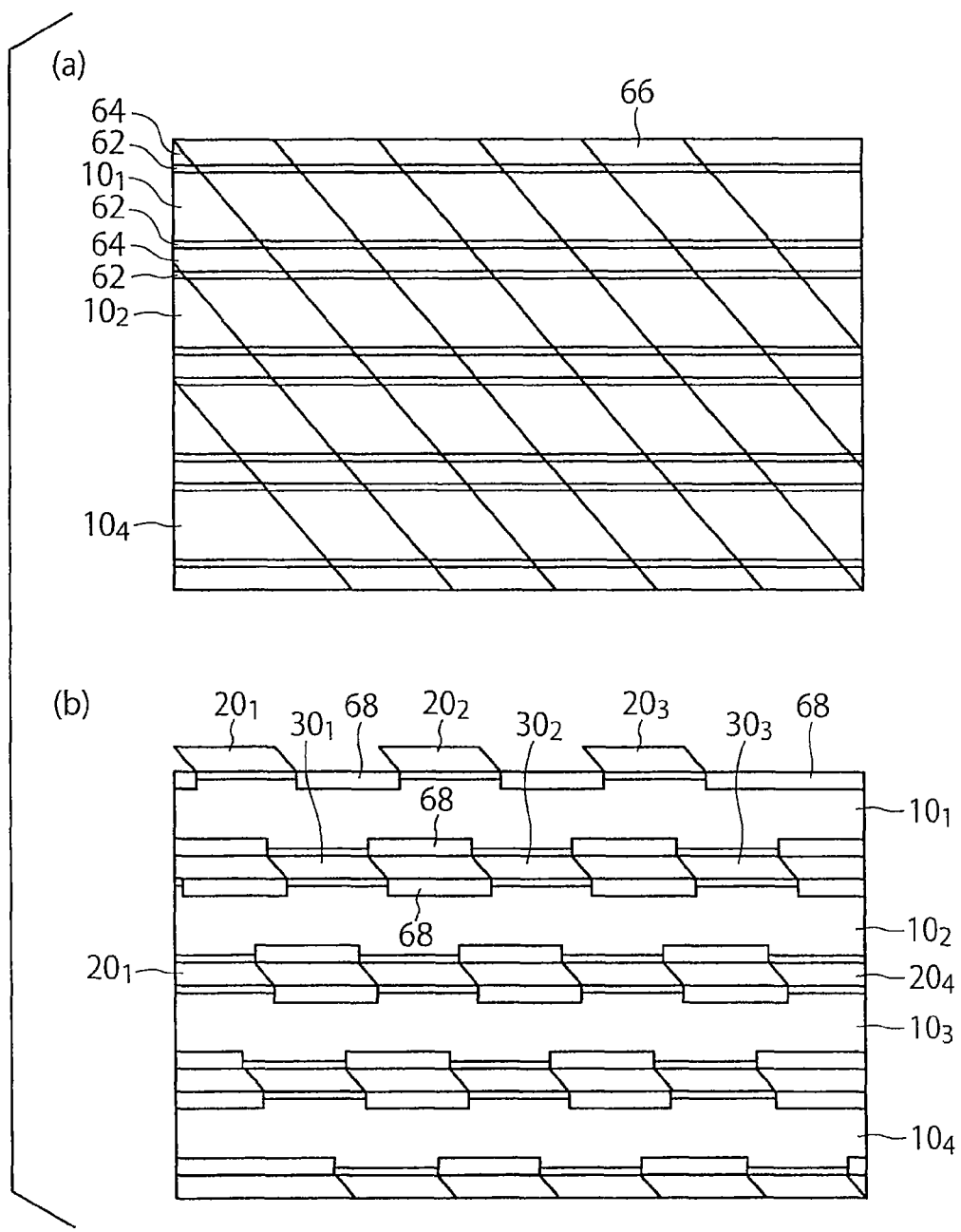
FIGS. 7(a) and 7(b) are plan views showing the process of manufacturing the magnetic memory according to the first embodiment.

Furthermore, it is also possible to read the direction of magnetization of the target cell TC-w by providing a detection line 44c to the reading unit 44 so as to be spaced apart from the magnetic nanowire 10 as shown in FIG. 5(b), for example, and using the induced electromotive force that is generated in the detection line 44c when the magnetic domain wall moves. Moreover, it is also possible to detect the direction of magnetization of the target cell TC-w as a spin wave signal by providing a spin wave transmission line 44d so as to be in contact with or apart from the magnetic nanowire 10 as shown in FIG. 5 (c).

As described above, the read operation can be performed by the reading unit. It is possible to read information that has been written to the whole of the magnetic nanowire by repeating the process of shifting a predetermined bit to the position of the reading unit, and monitoring the resistance value as in the case of the write operation.

The writing unit 42 and the reading unit 44 can also be provided to the magnetic nanowire 10 shown in FIG. 1 in the direction perpendicular to the paper surface.

(Manufacturing Method)

A method of manufacturing the magnetic memory according to the first embodiment will be described with reference to FIGS. 6(a) to 7(b), which are top views showing a process of manufacturing the shift register portion of magnetic memory according to the first embodiment.

First, as shown in FIG. 6(a), a magnetic film 10 is formed on a buffer film (not shown in the drawings), and a cap film (not shown in the drawings) is formed on the magnetic film 10. Then, the magnetic film 10 is processed to be in the shape of nanowires using a lithography technique and an etching technique, thereby forming a plurality of magnetic nanowires $10_1$ to $10_4$, which are arranged to be in parallel with each other. The width of the magnetic nanowires $10_i$ (i=1, 2, 3, 4) is, for example, 10 nm. Grooves 60 are formed on the sides of the magnetic nanowires $10_i$ (i=1, 2, 3, 4), the cap film, and the buffer film.

Next, as shown in FIG. 6(b), an insulating film 62 is formed on each side of the magnetic nanowire $10_i$ (i=1, 2, 3, 4), the cap film, and the buffer film, and an electrode film 64 is formed on a side of the insulating film 62 opposite to the magnetic nanowire $10_i$ (i=1, 2, 3, 4). That is, the insulating film 62 and the electrode film 64 are formed in a trench. The insulating film 62 is formed by filling each trench 60 with an insulating film, and etching the insulating film using an RIE (Reactive Ion Etching) method. The electrode film 64 is formed in the same manner as the insulating film 62.

Subsequently, as shown in FIG. 7(a), masks 66 in the form of oblique lines relative to the magnetic nanowires $10_1$ to $10_4$ are formed using a lithography technique to perform selective etching of the electrode films 64, thereby forming the first and the second control electrodes. In the etching process, it is preferable that the etching of each electrode film 64 be performed to the boundary between the buffer film (not shown in the drawings) and the magnetic nanowire 10, but not to the lower end of the buffer film. In this manner, the first control electrodes $20_i$ (i=1, ...) and the second control electrodes $30_i$ (i=1, ...) are independently formed on the sides of the magnetic nanowires $10_1$ to $10_4$, but the lower sides of the first control electrodes $20_i$ (i=1, ...) and the second control electrodes $30_i$ (i=1, ...) are short-circuited by the remaining electrode films.

Thereafter, as shown in FIG. 7(b), an oxidizing process is performed in an oxygen plasma atmosphere to partially oxidizing a portion of the sides of the magnetic nanowires $10_i$ (i=1, 2, 3, 4) where none of the first control electrode $20_i$ (i=1, ...) and the second control electrode $30_i$ (i=1, ...) is formed, thereby forming insulating films 68, which narrow the magnetic width of the magnetic nanowires $10_i$ (i=1, 2, 3, 4). Incidentally, it is possible to remove the insulating films 62 by wet etching before the oxidization process in order to effectively proceed with the oxidizing process. In this case, the way of narrowing the width of nanowires is not limited to the oxidization process but an etching process can also be performed to narrow the width of the magnetic nanowire $10_i$ (i=1, 2, 3, 4). In this manner, the shift register portion of the magnetic memory is formed.

In the magnetic memory manufactured by the aforementioned manufacturing method, there are a plurality of magnetic nanowires $10_1$ to $10_4$ arranged in parallel, and adjacent magnetic nanowires $10_i$, $10_{i+1}$ (i=1, 2, 3) share the first control electrodes or second control electrodes sandwiched therebetween.

(Material of Magnetic Nanowire 10)

The magnetic nanowire is formed of, for example, a single metal or alloy containing at least one element selected from the group consisting of iron (Fe), cobalt (Co), nickel (Ni), manganese (Mn) and chromium (Cr). A magnetic alloy containing at least one element selected from the group consisting of the aforementioned elements can be used. Examples of such an alloy are permalloy (NiFe alloy) and CoFe alloy.

Depending on the necessity, a magnetic material having a high uniaxial anisotropy constant Ku and shows a perpendicular magnetic anisotropy can be used to form the magnetic nanowires. If a material with a high anisotropy constant Ku is used, the width of magnetic domain wall becomes narrow when no magnetic field or current is given. In this embodiment, if a material with a high anisotropy constant Ku is used to form the magnetic nanowires, the effect of extending the magnetic domain wall width can be obtained easily. Examples of such a material are an alloy containing at least one element selected from the group consisting of Fe, Co, Ni, Mn, and Cr, and at least one element selected from the group consisting of Pt, Pd, Ir, Ru, and Rh. The value of the uniaxial anisotropy constant can also be adjusted by the composition of the magnetic materials contained in the magnetic nanowires 10 or crystalline regularity determined by a heat treatment.

Furthermore, a magnetic material having a crystal structure of hcp (hexagonal close-packed) structure and showing a perpendicular magnetic anisotropy can be used to form the magnetic nanowires. For example, a material containing a metal having Co as a main ingredient can be used to form the magnetic nanowires, and another metal having the hcp structure such as a hard magnetic material containing CoPt or CoPt with an additional element can also be used. Furthermore, a hard magnetic material containing FePt or FePt with an additional element can also be used.

The direction of magnetization of the magnetic nanowire can be substantially perpendicular or substantially parallel to the direction in which the magnetic nanowires extend. When the direction of magnetization is substantially perpendicular, it is possible to reduce the current value when the magnetization is written using an MTJ element.

Moreover, Co, CoPt alloy, or CoCrPt alloy can be used to form the magnetic nanowires. These materials each have a high magnetic anisotropy, and have the easy magnetization axis of the magnetic anisotropy in the plane. Furthermore, these materials each have a metal crystal with the c-axis of the hcp structure being in the plane. Materials obtained by adding an additional element to the above materials can also be used.

A Co layer, CoPt layer, FePt layer, a stacked film containing Co and Ni (Co/Ni), TbFe layer, and so on can also be used to form the magnetic nanowires. CoPt mentioned above can be an alloy thereof. In each of these materials, the c-axis of the hcp structure is perpendicular to the film plane. In the case of the TbFe layer, it shows a perpendicular anisotropy when the content of Tb is 20 atomic % or more and 40 atomic % or less. Furthermore, materials obtained by adding an additional element to the aforementioned materials can also be used.

An alloy of a rare earth element and an iron group transition element showing a perpendicular magnetic anisotropy can also be used to form the magnetic nanowires. For example, at least one of GdFe, GdCo, GdFeCo, TbFe, TbCo, TbFeCo, GdTbFe, GdTbCo, DyFe, DyCo, and DyFeCo can be used.

A material obtained by adding at least one nonmagnetic element selected from the group consisting of Ag, Cu, Au, Al, Mg, Si, Bi, Ta, B, C, O, N, Pd, Pt, Zr, Ir, W, Mo, Nb, and H to one of the aforementioned materials can also be used to form the magnetic nanowires. It is possible to adjust the magnetic characteristics by adding such a nonmagnetic element. Furthermore, it is possible to adjust various solid state properties such as crystallinity, mechanical properties, and chemical properties by adding such a nonmagnetic element.

According to the magnetic memory of this embodiment, the magnetization information can be shifted not by current pulse drive but application of voltage. Therefore, if the number of digits of the shift register is increased to a few hundreds or more, it is possible to perform a stable and reversible shift operation with a low voltage and a low power consumption, resulting in that it is possible to provide a highly reliable and highly densified shift register type magnetic memory with a low power consumption.

Basically, only patterns on the line and space portion are used to form the shift register portion, which is advantageous in forming fine patterns. Not only lithography is directly used but also a side wall processing technique such as QSPT (Quad-Spacer-Patterning) and a pitch reduction technique such as a DSA (Directed-Self-Assembly), which are well-known techniques, can be easily used, which contributes to the high densification of the memory.

The lower portions of the first control electrodes $20_i$ (i=1, ...) and the second control electrodes $30_i$ (i=1, ...) are short-circuited, respectively. Accordingly, if a contact is formed at the end portion of the shift register portion, it is not necessary to newly form a wiring for driving the first control electrodes $20_i$ (i=1, ...) and the second control electrode $30_i$ (i=1, ...), and it is not necessary to form other contacts. Thus, it is possible to obtain a shift register type magnetic memory suitable for simplification and miniaturization.

As described in the descriptions of the manufacturing process, first control electrodes $20_i$ (i=1, ...) and second control electrodes $30_i$ (i=1, ...) are alternately formed along a magnetic nanowire 10. Accordingly, adjacent magnetic nanowires 10 can share the electrodes. As a result, it is possible to obtain a highly densified shift register type magnetic memory.

(Modification)

Figure 8:
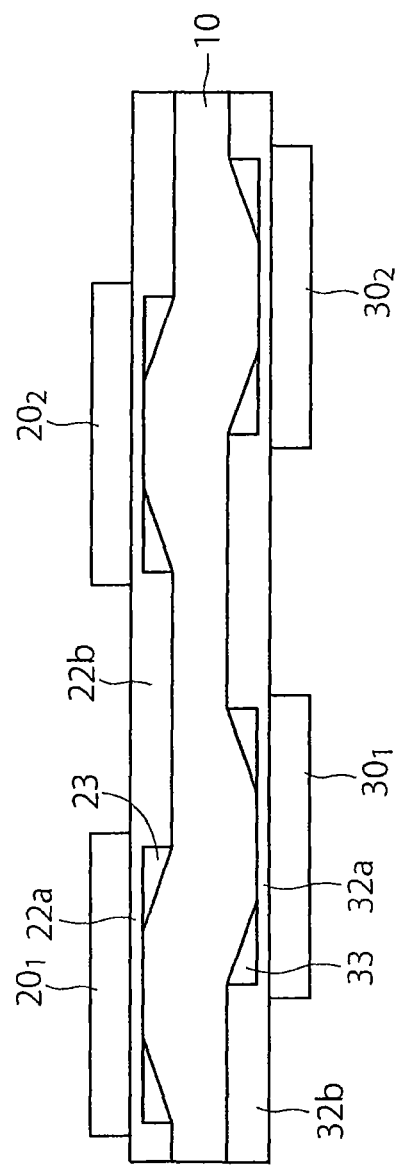
FIG. 8 is a top view of a shift register type magnetic memory according to a modification of the first embodiment.

A shift register type magnetic memory according to a modification of the first embodiment will be described with reference to FIG. 8, which is a top view of the shift register type magnetic memory of the modification.

In the first embodiment, the magnetic width of the magnetic nanowire is reduced by oxidizing the magnetic nanowire 10. In this process, if the oxidation under the first control electrodes and the second control electrodes advances to a extent in a rounding manner, a tapered oxidized portion is formed in a region 23 of the magnetic nanowire 10, which is near both the insulating films 22a and 22b, and another tapered oxidized portion (insulating film) is formed in a region 33 of the magnetic nanowire 10, which is near both the insulating films 32a and 32b, as in the modification shown in FIG. 8. These tapered insulating films 23, 33 each form an energy gradient, with which it is possible to move the magnetic domain wall more stably to a desired portion.

With the magnetic memory of this modification, it is possible to obtain the same effect as the first embodiment.

Although the magnetic width of the magnetic nanowire 10 is changed by means of the insulating films 22a, 22b, 32a, and 32b in the first embodiment and the modification thereof, if the materials of the magnetic nanowire 10 and the first and the second control electrodes are selected so that the work functions thereof differ from each other, it is not necessary to change the magnetic width of the magnetic nanowire 10 by means of the insulating films. In such a case, it is possible to locate the magnetic domain wall at a desired portion by means of the magnetic field caused by the difference between work functions, even if the power is in the OFF state, or the application of the voltage to the electrodes is stopped. In this case, the magnetic nanowire 10 has a predefined width in the direction along which the magnetic nanowire 10 extends. Also in this case, insulating films (for example, insulating films 22a, 32a) are provided between the magnetic nanowire 10 and the first and the second control electrodes.

Second Embodiment

Figure 9:
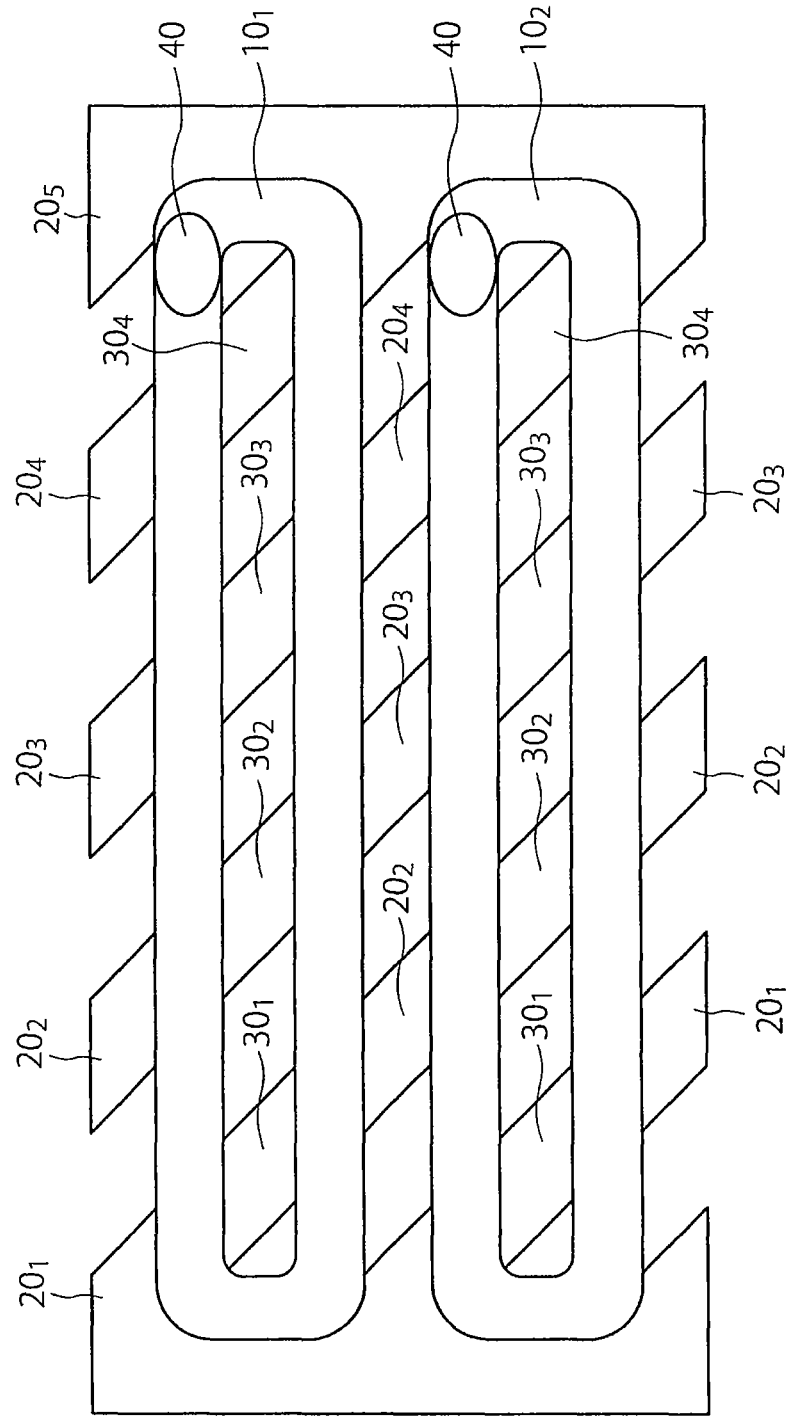
FIG. 9 is a top view showing a shift register type magnetic memory according to a second embodiment.

FIG. 9 shows a top view of a shift register type magnetic memory according to a second embodiment. In the magnetic memory of the second embodiment, the magnetic nanowire 10 of the magnetic memory according to the first embodiment is formed in a shape of a track, and to the end of a turn of the magnetic nanowire, an MTJ element 40 for reading and writing operations is provided. FIG. 9 shows that the magnetic nanowires $10_1$, $10_2$ of the magnetic memory described with reference to FIGS. 6(a) to 7(b) are each formed in the shape of a track. Incidentally, in FIG. 9, the insulating films 22a, 22b, 32a, 32b shown in FIG. 1 for explaining the first embodiment is omitted. As described in the descriptions of the first embodiment, if materials of the magnetic nanowire 10, the first control electrodes $20_i$ (i=1, ...), and the second control electrodes $30_i$ (i=1, ...) are selected so that the work functions thereof differ from each other, it is not necessary to change the magnetic width of the magnetic nanowire 10 by means of the insulating films. In such a case, insulating films (for examples, insulating films 22a, 32a) are provided between the magnetic nanowire 10 and the first control electrodes $20_i$ (i=1, ...) and the second control electrodes $30_i$ (i=1, ...).

The MTJ element 40 includes a reference layer having a magnetic layer, in which the magnetization is fixed and a tunnel barrier layer provided between the reference layer and the magnetic nanowire, and uses the magnetic nanowire $10_1$ or $10_2$ as a free layer. For example, the MTJ element 40 has the same structure as the writing unit 42 described with reference to FIGS. 4(a) and 4(b). Each of the magnetic nanowires $10_1$ and $10_2$ is connected to a source line (not shown in FIG. 9), and the reference layer of each MTJ element 40 is connected to a bit line (not shown in FIG. 9) via a cell transistor that is not shown in the drawings. To each bit line, a sense amplifier (not shown in FIG. 9) and a write driver (not shown in the drawings) are connected. At one or more positions in each of the magnetic nanowires $10_1$, $10_2$, a contact to the first and the second control electrodes is formed. The first and the second control electrode are connected to, for example, the driving circuits 50, 52 shown in FIG. 1.

In the second embodiment, each of the magnetic nanowires $10_1$, $10_2$ formed in the shape of a track functions as a shift register memory, and performs read and write operations by means of the MTJ element 40 provided at the end portion. The bit (magnetization information) once read returns, by the shift operation, to the original position in the magnetic nanowire $10_1$ or $10_2$ forming the shift register. Therefore, the magnetization information stored in the magnetic nanowires $10_1$, $10_2$ does not disappear after passing through the MTJ element 40. That is, a so-called "destructive readout" is not performed. Accordingly, it is not necessary to provide a buffer memory for temporarily storing information outside the memory array, leading to the cost reduction of the memory. Furthermore, since no destructive readout is performed, it is not necessary to perform write back operation of magnetization information, which is advantageous in terms of the reduction in power consumption.

Moreover, since the shift operation is not performed by means of current pulses, it is possible to avoid the interference between the generation of current during a read or write operation and the shift operation, resulting in that it is possible to obtain a highly reliable magnetic memory.

Third Embodiment

Figure 10:
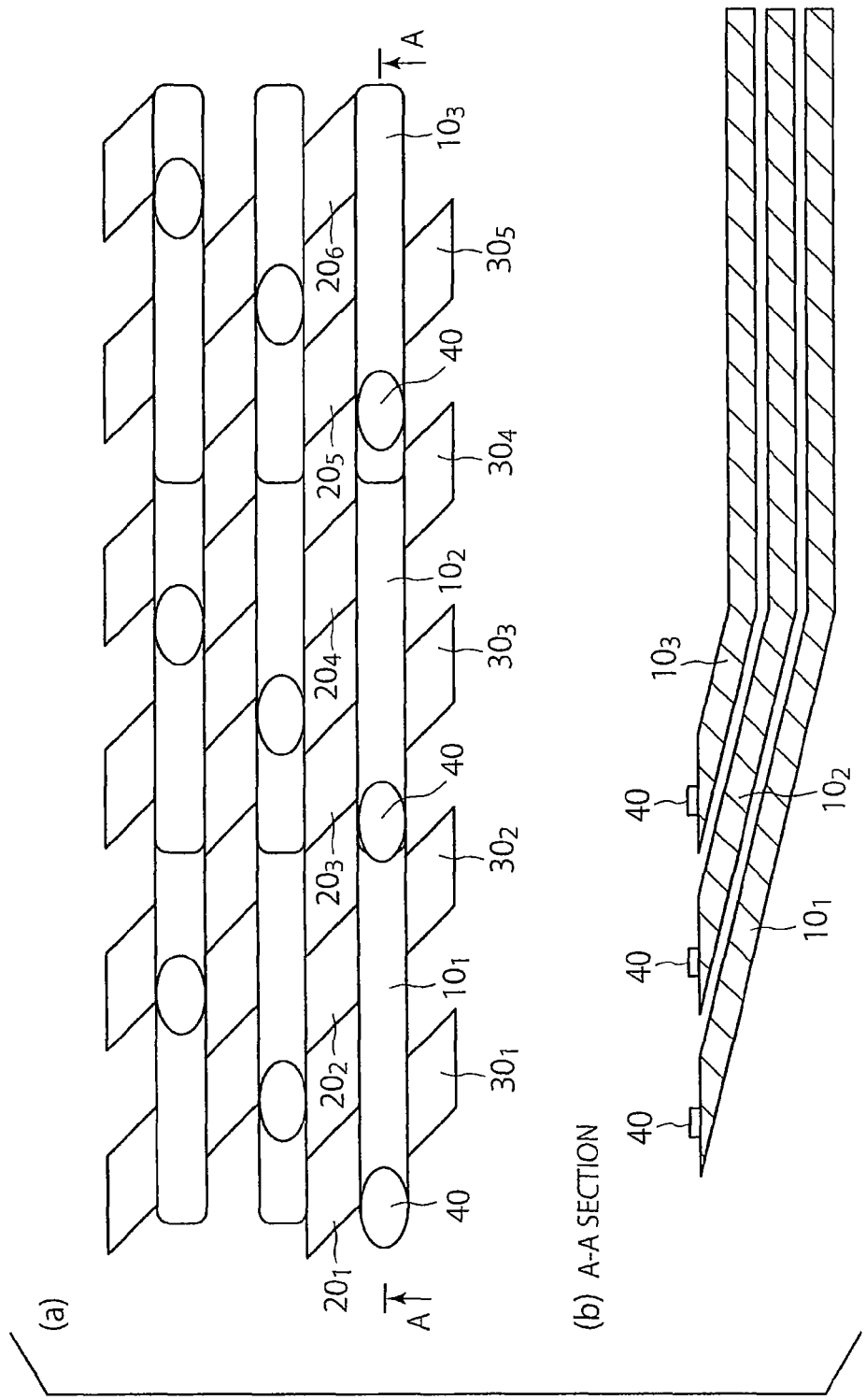
FIGS. 10(a) and 10(b) are a top view and a cross-sectional view of a shift register type magnetic memory according to a third embodiment.

A shift register type magnetic memory according to a third embodiment will be described with reference to FIGS. 10(a) and 10(b). FIG. 10(a) is a top view of the magnetic memory according to the third embodiment, and FIG. 10(b) is a cross-sectional view sectioned along the line A-A shown in FIG. 10. The magnetic memory according to the third embodiment has a stacked memory array structure.

As shown in FIGS. 10(a) and 10(b), each of the stacked magnetic nanowires $10_1$, $10_2$, $10_3$ has a slope at an end thereof, on the top of which an MTJ element 40 for read and write operations is formed. Furthermore, as shown in FIG. 10(a), a plurality of sets of stacked magnetic nanowires $10_1$, $10_2$, $10_3$ are arranged in parallel.

The stacked magnetic nanowires $10_1$, $10_2$, $10_3$ share the first control electrodes $20_i$ (i=1, ...) and the second control electrodes $30_i$ (i=1, ...) provided on the sides of the stacked magnetic nanowires $10_1$, $10_2$, $10_3$. Each of the stacked magnetic nanowires $10_1$, $10_2$, $10_3$ can exchange the magnetization information by the shift operation with the MTJ element 40 provided thereon. For example, a nonmagnetic conductive film is provided between adjacent two of the stacked magnetic nanowires $10_1$, $10_2$, $10_3$, by which each of control electrodes stacked are short-circuited, and connected to a word line that is not shown in FIGS. 10(*a*) and 10(*b*). A nonmagnetic insulating film can be provided between adjacent two of the stacked magnetic nanowires $10_1$, $10_2$, $10_3$ instead of the nonmagnetic conductive film. In FIG. 10(*a*), the insulating films 22*a*, 22*b*, 32*a*, 32*b* shown in FIG. 1 for explaining the first embodiment are omitted. As described in the descriptions of the first embodiment, if materials of the magnetic nanowire 10 and the first and the second control electrodes are selected so that the work functions thereof differ from each other, it is not necessary to change the magnetic width of the magnetic nanowire 10 by means of the insulating films. In such a case, however, insulating films (for example, insulating films 22*a* and 32*a*) are provided between the magnetic nanowire 10 and the first and the second control electrodes.

Next, a method of manufacturing a magnetic memory according to the third embodiment will be described below.

First, a part of the lowermost interlayer film is processed to have a mountain shape or trapezoid shape. Specifically, a method of forming a slope in a photoresist mask by sequentially changing the transmissivity of the mask when lithography is performed can be used.

Subsequently, magnetic films and nonmagnetic insulating films to serve as interlayer films are alternately stacked, and the top surfaces thereof are smoothed, thereby forming a magnetic layer, an end of which is exposed at the top portion by means of the slope. Thereafter, a cap layer that is not shown in FIGS. 10(*a*) and 10(*b*) is deposited, and in the same manner as in the first embodiment, the control electrodes are formed. Then, the cap layer in the slope portion is removed, thereby forming an MTJ element 40 by using a well-known manufacturing method.

Since the third embodiment has a stacked magnetic nanowire structure, it is not necessary to perform lithography or processing on each layer. Accordingly, it is possible to obtain a magnetic memory in which the capacitance density per chip area is improved and the manufacturing cost is reduced. Accordingly, it is possible to reduce the costs of large capacity shift register memory.

By providing the MTJ element 40 on the slope portion, the lower surface of the free layer of the MTJ element 40 has a taper angle, whereby the thickness of the free layer is substantially decreased. As a result, the current density caused by the MTJ element 40 at the time of the spin transfer writing can be decreased, thereby decreasing the power consumption.

Furthermore, by performing the shift operation by voltage drive, the written information is immediately transferred to a part of the magnetic nanowire 10, which has a sufficient thickness. Accordingly, a good data retaining characteristic can be maintained, and a memory with a low power consumption and a reliability can be obtained.

Fourth Embodiment

A shift register type magnetic memory according to a fourth embodiment will be described with reference to FIG. 11, which is a cross-sectional view of the magnetic memory of the fourth embodiment.

The magnetic memory according to the fourth embodiment has at least one memory cell column 2 forming a vertical shift register. The memory cell column 2 includes a magnetic film 10A having a tubular main body 10Aa and a bottom portion 10Ab connecting to the main body 10Aa, first control electrodes $20_i$ (i=1, . . . ) provided onto one of the two opposing sides of the main body 10Aa of the magnetic film 10A and spaced apart from each other along the long axis of the main body 10Aa, second control electrodes $30_i$ (i=1, . . . ) provided onto the other side of the main body 10Aa of the magnetic film 10A and spaced part from each other along the long axis of the main body 10Aa, and an MTJ element 40 provided to be close to the bottom portion 10Ab of the magnetic film 10A. The MTJ element 40 is an element for read and write operations, having the magnetic film 10A as a free layer.

The inside 16 of the tubular magnetic film 10A is either hollow or filled with an insulating film or conductive film. Although this feature is not shown in FIG. 11, the outer diameter of the tubular magnetic film 10A is larger in a portion where at least one of a first control electrode and a second control electrode are present, and smaller in a portion where none of the first and the second control electrodes is present. On the other hand, the inner diameter of the magnetic film 10A does not change in the same manner as the outer diameter, and is relatively constant. Therefore, the thickness of the magnetic film 10A is thicker in the portion where at least one of a first control electrode and a second control electrode are present, and thinner in the portion where none of the first and the second control electrodes is present. The magnetic film 10A is a perpendicular magnetization film in which the direction of magnetization is perpendicular to the film plane. In each magnetic domain, the direction of magnetization is inward, i.e., toward the inside of the main body 10Aa, or outward, i.e., toward the outside of the main body 10Aa, depending on the contents of the magnetization information. In such a case, the magnetization of the bottom portion 10Ab is either upward or downward in FIG. 11, and a read or write operation is performed by the MTJ element 40, for which the perpendicular magnetization film serves as a reference layer. Furthermore, the magnetic film 10A is connected to a bit line BL at its upper portion. Incidentally, the reference layer of the MTJ element 40 is connected to a source line (not shown in FIG. 11) via a cell transistor (not shown in the drawings) having a word line (not shown in FIG. 11) as a gate electrode.

An interlayer insulating film 26 is provided between adjacent two first control electrodes $20_i$, $20_{i+1}$ (i=1, . . . ), and an interlayer insulating film 36 is provided between adjacent two second control electrodes $30_i$, $30_{i+1}$ (i=1, . . . ). The first control electrodes $20_i$ (i=1, . . . ) are short-circuited by a wire etc., and the second control electrodes $30_i$ (i=1, . . . ) and also short-circuited by a wire etc. Although this feature is not shown in FIG. 11, an insulating film 22 is provided between the magnetic film 10A and the first and the second control electrodes $20_i$, $30_i$ (i=1, . . . ), as shown in FIG. 12.

The first control electrodes $20_i$ (i=1, . . . ) and the second control electrodes $30_i$ (i=1, . . . ) are shifted from each other about ¼ of the stacking pitch. Herein, the stacking pitch of the first control electrodes $20_i$ (i=1, . . . ) means the distance between the centers of adjacent two first control electrodes $20_i$, $20_{i+1}$ (i=1, . . . ) in the direction along the long axis of the main body 10Aa. The first control electrodes $20_i$ (i=1, . . . ) and the second control electrodes $30_i$ (i=1, . . . ) are short circuited in the stacking direction at the end of the memory cell column 2, and connected to a driver transistor, which is not shown in FIG. 11.

Figure 11:
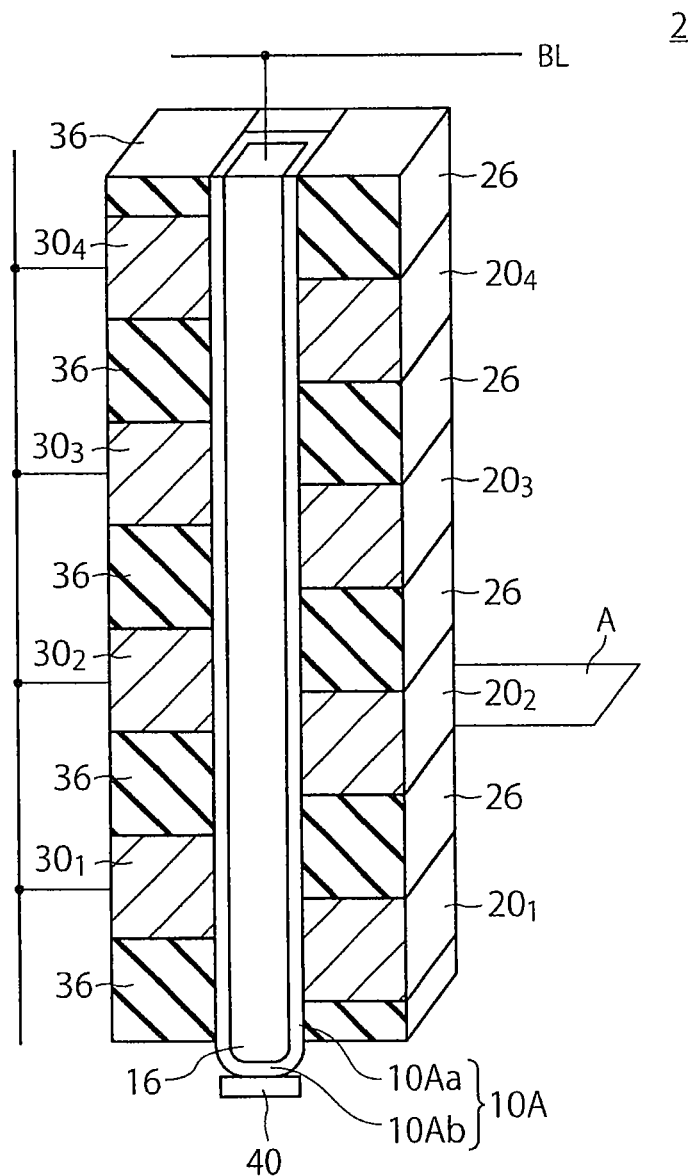
FIG. 11 is a cross-sectional view showing a shift register type magnetic memory according to a fourth embodiment.
Figure 12:
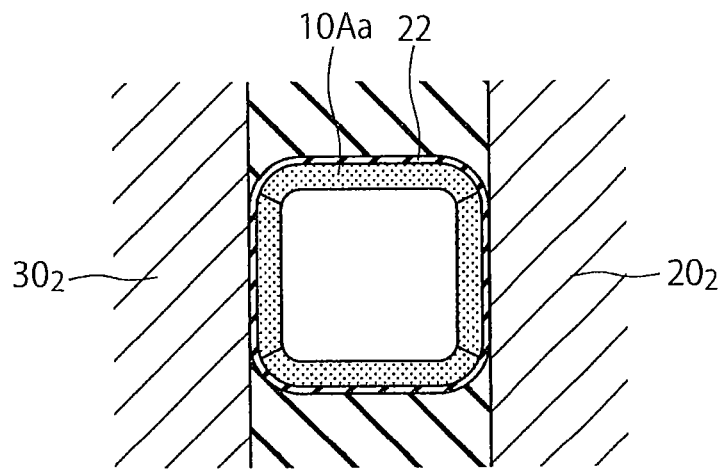
FIG. 12 is a cross-sectional view of a shift register type magnetic memory according to the fourth embodiment.

FIG. 12 shows a section of a memory cell column 2 viewed from above, taken along a cutting plane A shown in FIG. 11. The cutting plane A is a plane passing through a region where a first control electrode $20_2$ and a second control electrode $30_2$ are present with the magnetic film 10A being sandwiched therebetween. The outer shape of the magnetic film 10A in the section perpendicular to the long axis of the tubular main body 10Aa is a square with corner portions being rounded. Furthermore, as can be understood from FIG. 12, an insulating film 22 is provided around the main body 10Aa of the magnetic film 10A, which electrically insulates the main body 10Aa from the first and the second control electrodes $20_i$, $30_i$ (i=1, ... ).

(Manufacturing Method)

Next, a method of manufacturing the magnetic memory according to the fourth embodiment will be described with reference to FIGS. 13(a) and 13(b).

Figure 13:
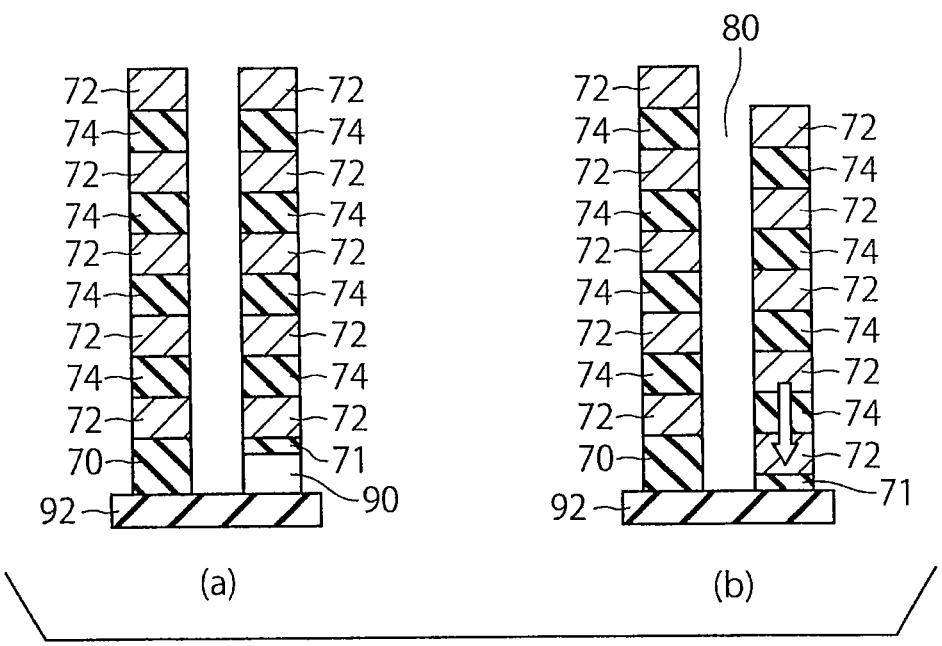
FIGS. 13(a) and 13(b) are drawings for explaining a process of manufacturing the shift register type magnetic memory according to the fourth embodiment.

By using known techniques, a cell transistor (not shown in FIGS. 13(a) and 13(b)), and a reference layer of the MTJ element 40 are formed. Then, a stopper insulating film 92 is deposited, and a height adjusting interlayer film 90 is deposited. The height adjusting interlayer film 90 is processed to be in a shape of a line by lithography and RIE processes, so as to remain only at the location of the first control electrodes 20 that are provided later. Subsequently, an interlayer insulating film is deposited, and the top surface thereof is smoothed using, for example, CMP (Chemical Mechanical Polishing). As a result, a thick interlayer insulating film 70 is left in a region where the height adjusting interlayer film 90 is not formed, and a thin interlayer insulating film 71 is left in a region where the height adjusting interlayer film 90 is formed. Then, electrode films 72 and interlayer insulating films 74 are alternately deposited, and finally, a cap film (not shown in FIGS. 13(a) and 13(b)) is deposited. In this manner, a stacked electrode in the line shape, which includes the first and the second control electrodes, is formed by lithography and RIE method (see FIG. 13(a)).

Then, by performing anisotropic etching on the height adjusting interlayer film 90, the first control electrode 72 formed on the height adjusting interlayer film 90 is sunk to be shifted below by ¼ pitch relative to the second control electrode 72 in the region where the height adjusting interlayer film 90 is not formed (FIG. 13(b)). A first example of the height adjusting interlayer film 90 is a carbon film formed by, for example, CVD. In this case, an ashing method can be used as the etching method. Other films that can be selectively etched can also be used. A second example of the height adjusting interlayer film 90 is a Si film under which for example a Ni film is provided. The thickness of the electrodes can be reduced by a heat treatment, by which the Ni film is absorbed by the Si film by a silicide reaction. A third example of the height adjusting interlayer film 90 is a titanium film. By performing a heat treatment on the titanium film in an oxygen atmosphere at a temperature of 400° C., the titanium film is oxidized to expand, thereby shifting the locations of the first control electrodes and the second control electrodes.

Thereafter, an insulating film (not shown in FIGS. 13(a) and 13(b)) such as a TEOS film is filled by, for example, a CVD method, and the top surface thereof is removed by etching, thereby filling the spaces among the stacked control electrodes. Then, a photoresist mask (not shown in FIGS. 13(a) and 13(b)) having an opening 80 in a shape of a trench that is perpendicular to the stacked control electrodes is formed by a lithography method, and the insulating film that has been filled is selectively etched relative to the cap film.

Figure 14:
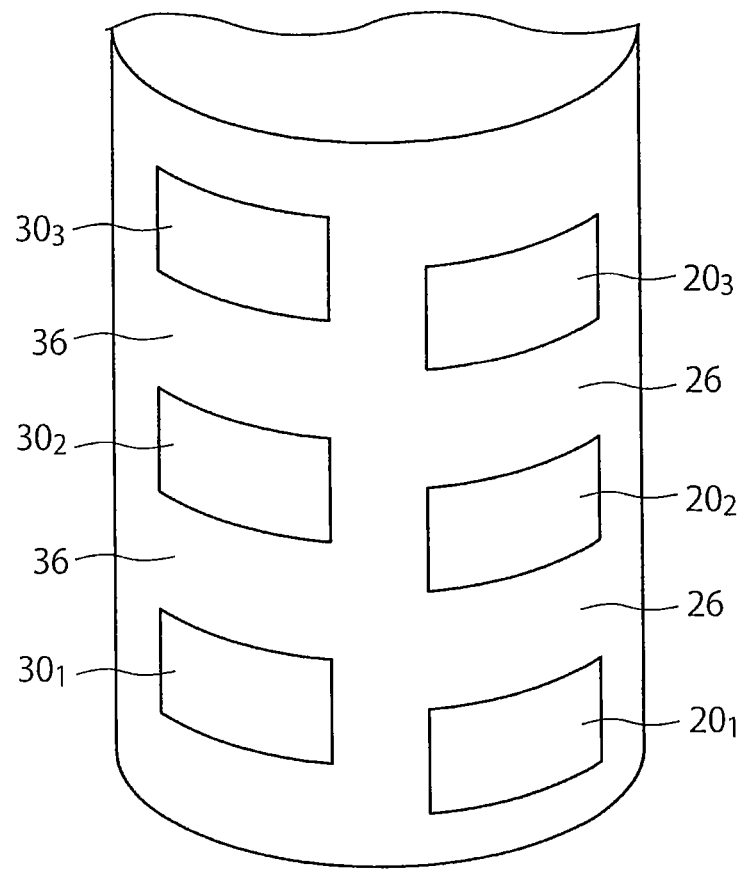
FIG. 14 is a drawing obtained by projecting first and second control electrodes onto a magnetic film, and developing the magnetic film.

Then, the control electrode exposed in the opening 80 is caused to recede by wet etching (not shown in FIGS. 13(a) and 13(b)). It is preferable that an insulating layer (not shown in FIGS. 13(a) and 13(b)) is formed by, for example, an oxidization process on the exposed surface. Subsequently, after the stopper insulating film 92 located below is selectively removed, for example, an MgO film (not shown in FIGS. 13(a) and 13(b)) to serve as a tunnel insulating film of the MTJ element 40 is deposited, and the tubular magnetic film 10A of, for example, a CoFeB film, is deposited. Furthermore, a nonmagnetic conductive film is deposited inside the magnetic film 10A, and the conductive film, the magnetic film, and the tunnel insulating film located above are removed. Thereafter, a contact plug and wiring are provided, thereby completing the magnetic memory including the memory cell column 2. The outer shape of the memory cell column 2 can be a square pole or a circular column. FIG. 14 shows a drawing obtained by projecting the first control electrodes $20_i$ (i=1, ... ) and the second control electrodes $30_i$ (i=1, ... ) onto the magnetic film 10A and developing the magnetic film 10A.

The change in magnetic anisotropy caused by the field effect is greater at the film interface and becomes relatively smaller as the thickness of the magnetic film increases. Therefore, the use of an ultrathin magnetic film is effective. However, the degree of technical difficulty of the process of providing control electrodes at both the sides of a magnetic film having a thickness of a few nm is high. Since a tubular magnetic thin film is used in the fourth embodiment, if control electrodes are provided to both the sides of the tube using an opening having a diameter of 10 nm or more, it is possible to obtain a stable and effective field effect.

Generally, the thickness of the control electrodes to be stacked can be highly controlled as compared with the in-plane size accuracy in a lithography method, and it is possible to form the control electrodes with a controllability of a few nm. As a result, it is possible to use electrodes that are stacked with a fine pitch, thereby improving the bit density (the digits of shift register) in a vertical direction. Furthermore, when the space between adjacent control electrodes is narrowed, a problem of interlayer capacity between control electrodes often arises. However, since all of the control electrodes in the stacking direction are short-circuited in this embodiment, the potential thereof is the same. As a result, no problem of capacity arises between electrodes that are adjacent to each other in the stacking direction. Furthermore, there is no problem of interlayer leakage current. Accordingly, it is possible to determine the pitch of the control electrodes freely based on the magnetic requirement from the magnetic film without any electrical limitation.

A vertical shift register allows the formation of an MTJ element 40 for read and write operations with a relatively high density. This means that the number of shift registers that can be accessed simultaneously is increased. As a result, it is possible to easily obtain a magnetic memory having a high throughput.

Because the positions of either the first control electrodes or the second control electrodes are shifted by ¼ pitch relative to the positions of the other control electrodes by using the height adjusting interlayer film 90, it is possible to considerably change the height of control electrodes that are adjacent to each other with a narrow pitch. Since the heights of the stacked control electrodes 74 are constant when the trench 80 is formed, the processing of the trench 80 is performed perpendicularly relative to the respective films. Thus, it is possible to effectively prevent the trench 80 from being formed in an inclined manner. Because of this, the control electrodes can be positioned relative to the MTJ element 40 formed below with a high accuracy, thereby contributing to the throughput of the magnetic memory and improving the density thereof.

The insulating film between the control electrode and the tubular magnetic film can be formed to have a double-layer structure including, for example, an MgO film and an oxide layer of the electrode. With such a stacked structure, it is possible to improve the withstand voltage of the control electrodes while generating an interface induced perpendicular magnetic anisotropy of the magnetic film (for example, formed of CoFeB).

The tubular magnetic film is filled with a nonmagnetic conductive film, and a contact is provided thereto to apply a voltage between the magnetic film and the control electrodes, or to perform a read or write operation of the MTJ element 40. In a system using interface induced magnetic anisotropy, it is preferable that a magnetic film be an ultra-thin film having a thickness of a few nm. However, if a single magnetic film is used, because of its thinness, it tends to have a high resistance. However, by using a nonmagnetic conductive film filled in the tubular magnetic film as in this embodiment, it is possible to considerably reduce the resistance of the magnetic film, thereby achieving a high-speed operation of the memory.

Although the MTJ element 40 is formed near the bottom portion 10Ab of the magnetic film 10A in the fourth embodiment, it is possible to form it near the main body 10Aa of the magnetic film 10A. In this case, since the main body 10Aa is tubular, it is possible to form the MTJ element 40 to have a torus shape or to have a shape partially cut by a cylinder that matches the shape of the tubular main body 10Aa. In the case of the partially-cut shape, since the reference layer of the MTJ element 40 has shape anisotropy, there is an advantage in that the magnetization of the reference layer can be easily performed. On the other hand, if the MTJ element 40 is formed to have a torus shape, it is possible to perform magnetization by forming it to have a decentered shape. Alternatively, in order to magnetize an MTJ element having a center that is identical with the center of the main body 10Aa of the magnetic film 10A, for example, a tapering process is performed on the MTJ element 40 to have a trapezoid section. In this manner, it is possible to obtain a reference layer having a magnetization toward the center of the torus or toward the outside thereof by applying a high magnetic field perpendicularly to a substrate plane, and then removing the magnetic field.

It is also possible to fold back the magnetic film 10A at the lower portion thereof so as to have a U shape. In such a case, it is possible to perform a non-destructive read operation, thereby enabling the reduction of buffer memory. In this case, the MTJ element is provided to be close to the bottom portion of the magnetic film 10A having the U shape.

Although the tubular magnetic film 10A is filled with a nonmagnetic conductive film in the above descriptions, if the resistance value of the magnetic film is not too high, the filling with the nonmagnetic conductive film is not necessarily performed, and the tubular magnetic film 10A can be filled with a nonmagnetic insulating film or can be left to be hollow.

If the diameter of the tubular magnetic film becomes narrower, e.g. 10 nm or less, it is not necessary to have a tubular shape, but the inside can be filled with the magnetic film to have a column shape magnetic film.

In the above descriptions, a perpendicular magnetization film is used to form the tubular magnetic film 10A so that the direction of magnetization is inward or outward. However, it is also possible to discriminate between the types of magnetization information using an in-plane magnetization film in which the direction of magnetization is parallel to the film plane, based on whether the direction of magnetization is clockwise or counterclockwise. In this case, it is preferable that the reference layer of the MTJ element 40 should have a decentered torus shape or have a shape cut by a cylinder as described above.

According to the fourth embodiment, it is possible to obtain not only a shift register type magnetic memory that shifts magnetization information not by current pulse drive but by applying voltage. Accordingly, even if the digits of the shift register are increased to be a few hundreds or more, it is possible to perform the shift operation reversibly and stably with a low voltage and a low power consumption. Accordingly, it is possible to obtain a highly reliable nonvolatile memory with a low power consumption and a high density.

(First Modification)

Figure 15:
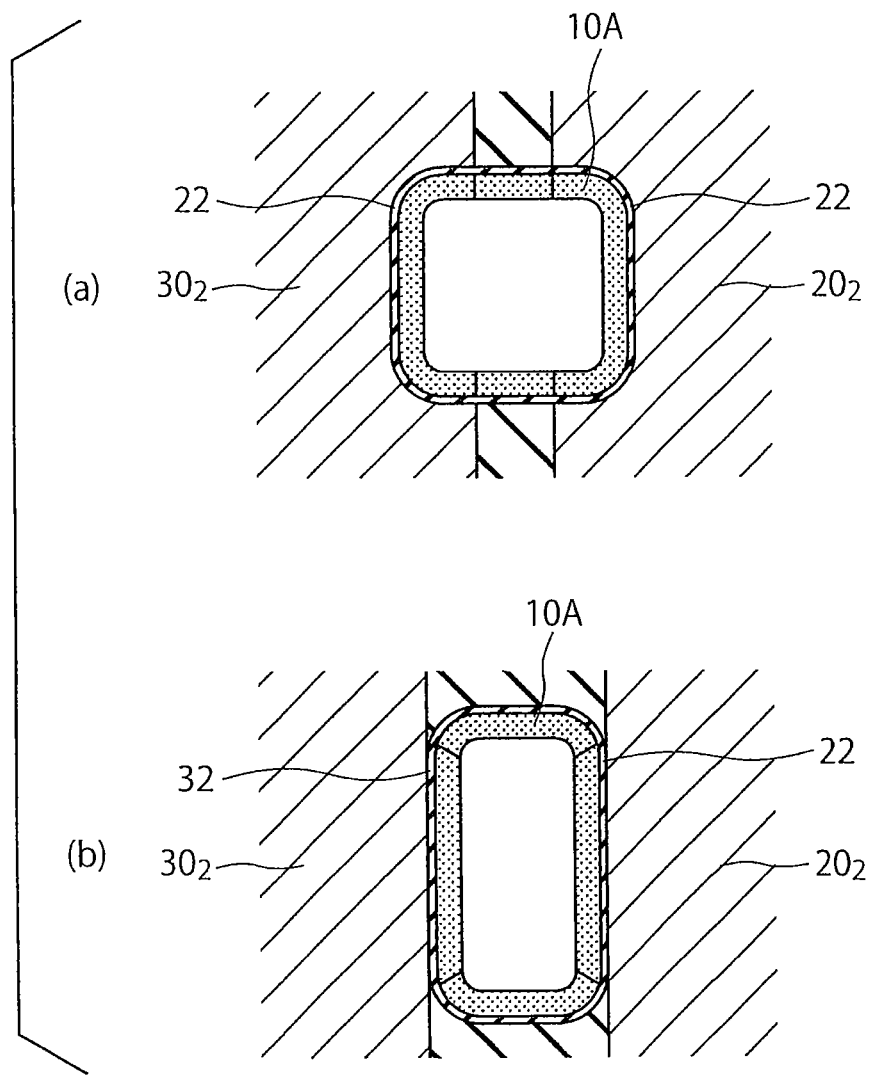
FIGS. 15(a) and 15(b) are cross-sectional views of shift register magnetic memories according to first and second modifications of the fourth embodiment.

A shift register type magnetic memory according to a first modification of the fourth embodiment will be described with reference to FIG. 15(*a*), which is a cross-sectional view of the magnetic memory according to the first modification corresponding to FIG. 12 of the fourth embodiment. The magnetic memory of the first modification has a structure obtained by adding a magnetic film to the magnetic memory of the fourth embodiment so as to cut into the first and the second control electrodes $20_i$, $30_i$ (i=1, ... ).

With such a structure, the region that can be controlled by the electric field generated by the first and the second control electrodes $20_i$, $30_i$ (i=1, ... ) in the periphery portion of the main body 10Aa of the tubular magnetic film 10A increases, resulting in that it is possible to perform the shift operation with a lower voltage.

(Second Modification)

A shift register type magnetic memory according to a second modification of the fourth embodiment will be described with reference to FIG. 15(*b*), which is a cross-sectional view of the magnetic memory according to the second modification corresponding to FIG. 12 of the fourth embodiment. The magnetic memory of the second modification has a structure in which the external shape of the section of the magnetic film 10A cut in the direction perpendicular to the long axis of the tubular main body 10Aa is elongated along the direction in which the first and the second control electrodes $20_i$, $30_i$ (i=1, ... ) extend in the magnetic memory of the fourth embodiment. That is, the external shape of the section of the magnetic film 10A is a rectangle with rounded corner portions, and the long axis extends in the direction along which the first and the second control electrodes $20_i$, $30_i$ (i=1, ... ) extend.

With such a structure, the region that can be controlled by the electric field generated by the first and the second control electrodes $20_i$, $30_i$ (i=1, ... ) in the periphery portion of the main body 10Aa of the tubular magnetic film 10A increases, resulting in that it is possible to perform the shift operation with a lower voltage.

(Third Modification)

Figure 16:
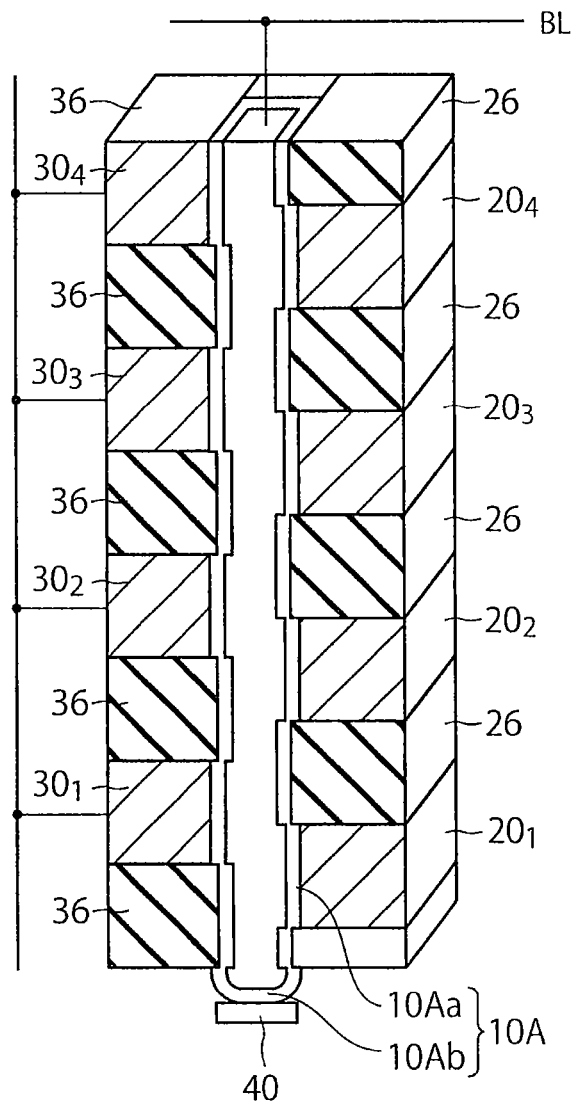
FIG. 16 is a cross-sectional view of the magnetic memory according to a third modification of the fourth embodiment.

A shift register type magnetic memory according to a third modification of the fourth embodiment will be described with reference to FIG. 16, which is a cross-sectional view of the magnetic memory according to the third modification. The magnetic memory of the third modification is obtained by locating the interface between each of the first and the second control electrodes $20_i$, $30_i$ (i=1, ... ) and the main body 10Aa of the magnetic film 10A so as to be more distant from the long axis of the tubular main body 10Aa than the interface between each of the interlayer insulating films 26, 36 and the main body 10Aa of the magnetic film 10A in the magnetic memory of the fourth embodiment shown in FIG. 11.

With such a structure, it is possible to shorten the length of the periphery portion of the magnetic film 10A between a first control electrode and an interlayer insulating film 36 and the length of the periphery portion of the magnetic film 10A between a second control electrode and an interlayer insulating film 26 relative to the length of the periphery portion of the magnetic film 10A between a first control electrode and a second control electrode. Accordingly, it is possible to perform a shift operation by applying a voltage to the first and the second control electrodes to increase the anisotropic energy of the magnetic film 10A so that the magnetic domain walls move outwardly rather than inwardly as if ejection rather than suction is performed. In this case, the polarity of the voltage to be applied is opposite to that of the voltage applied in the fourth embodiment when the shift operation is performed in the same direction. In the state where no voltage is applied to the first and the second control electrodes, the magnetic domain wall of the magnetic film 10A is stable in the region between the interlayer insulating film 26 and the interlayer insulating film 36, so that it is possible to suppress the influence of the disturbance to the retention, the readout, and the write operations.

The magnetic memory according to the third modification can be formed by moving the control electrode 72 back from the trench 80 by performing the etching before forming the insulating film 22 shown in FIG. 12 in the method of manufacturing the magnetic memory according to the first embodiment.

Fifth Embodiment

Figure 17:
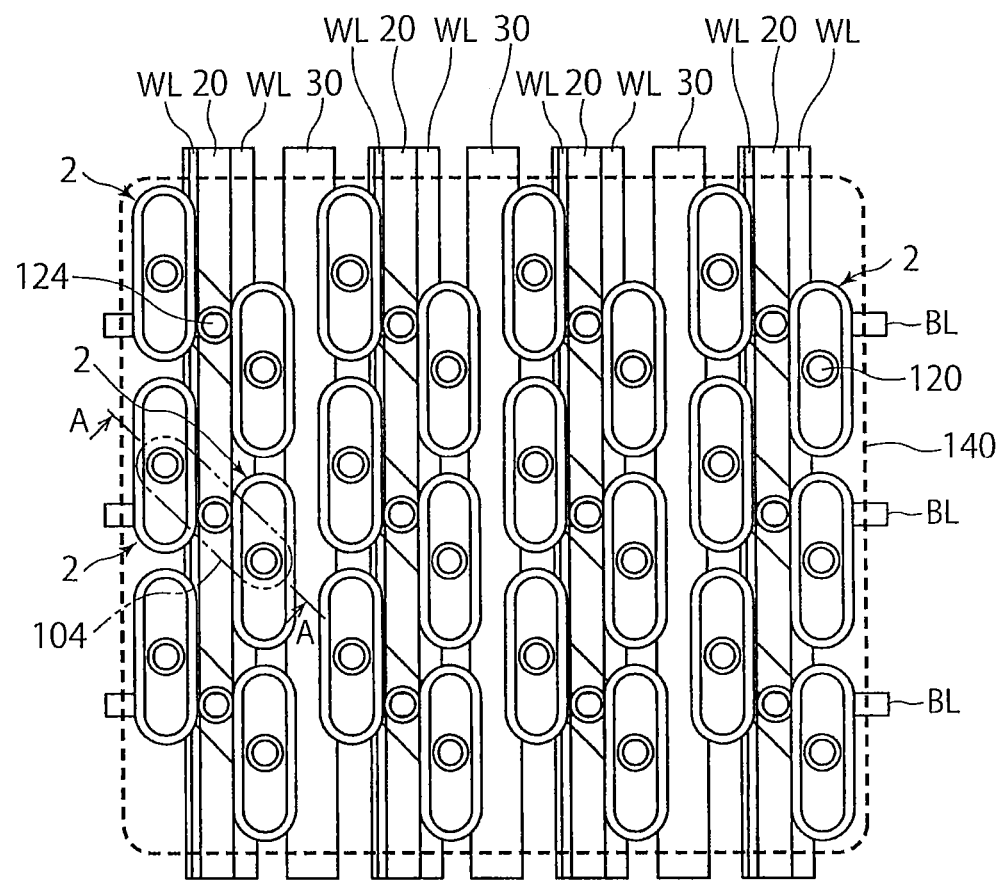
FIG. 17 is a top view of a shift register type magnetic memory according to a fifth embodiment.
Figure 18:
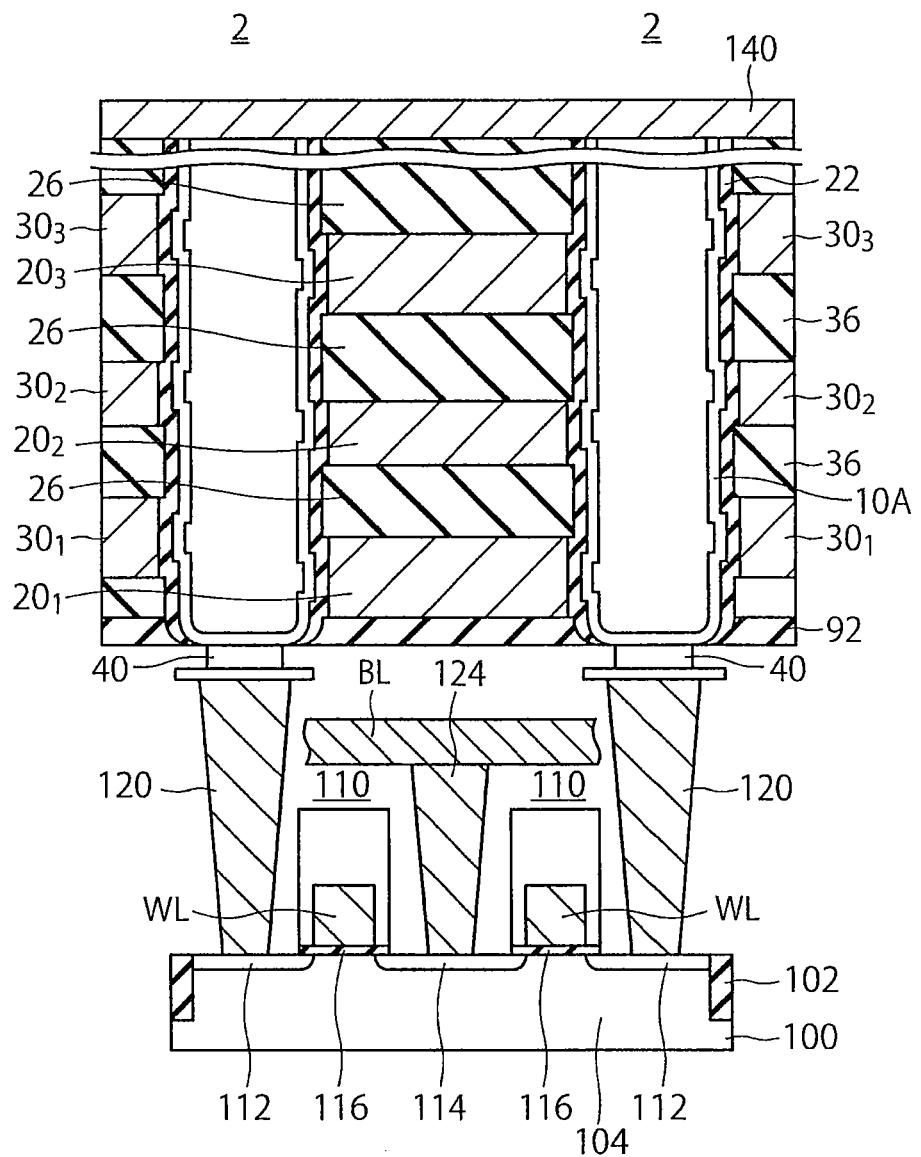
FIG. 18 is a cross-sectional view of memory cell columns of the magnetic memory according to the fifth embodiment.

A shift register type magnetic memory according to a fifth embodiment will be described with reference to FIGS. 17 and 18. FIG. 17 shows a top view of the magnetic memory according to the fifth embodiment. FIG. 18 shows a cross-sectional view taken along line A-A in FIG. 17. The magnetic memory of the fifth embodiment includes a plurality of memory cell columns 2 of the magnetic memory according to the third modification of the fourth embodiment shown in FIG. 16, of which two form a set of memory cell columns 2. A plurality of sets of memory cell columns 2 are arranged in an array. As shown in FIG. 17, in each memory cell column 2, the section of the magnetic film 10A cut in the direction perpendicular to the long axis of the tubular main body 10Aa has a track shape.

The memory cell columns 2 in each set are shifted relative to each other along the column direction (the vertical direction in FIG. 17). Furthermore, as shown in FIG. 17, the sets of memory cell columns 2 arranged in the same row share the same bit line BL. The sets of memory cell columns 2 arranged in the same column share the same word line WL.

In the magnetic memory of the fifth embodiment, the two memory cell columns 2 in each set are formed in an element region 104 of a semiconductor substrate 100. The element region 104 is isolated by an element isolation region 102 formed of an insulating film, as shown in FIG. 18. To each element region 104, two selection transistors 110 corresponding to the two memory cell columns 2 are provided. The two selection transistors 110 share a source and drain region 114, and a contact plug 124 is formed on the source and drain region 114, the contact plug 124 being connected to the bit line BL. On each of source and drain regions 112 of the two selection transistors 110, a contact plug 120 connecting to the MTJ element 40 of the corresponding memory cell column 2 is provided. Each gate of the two selection transistors 110 is provided onto the element region 104 between the source and drain regions via a gate insulating film 116, the gate serving as the word line WL.

In this embodiment, the two memory cell columns 2 in each set share the first control electrodes $20_i$ (i=1, ...). Instead of the first control electrodes $20_i$ (i=1, ...), the second control electrodes $30_i$ (i=1, ...) can be shared. The first control electrodes $20_i$ (i=1, ...) and the second control electrode $30_i$ (i=1, ...) extend in the column direction. Accordingly, the memory cell columns 2 arranged in the same column share the first control electrodes $20_i$ (i=1, ...) and the second control electrodes $30_i$ (i=1, ...). The first control electrodes $20_i$ (i=1, ...) used in the same memory cell column 2 can be electrically connected with each other at the array end using a contact etc. The same can be said for the second control electrodes $30_i$ (i=1, ...).

A common upper electrode 140 is formed above the plurality of memory cell columns 2 arranged in an array. Either the magnetic film 10A or the conductive film embedded in the tubular magnetic film 10A of each of the memory cell columns 2 is electrically connected to the upper electrode 140. Each bit line BL is connected to a sense amplifier or write circuit, which are not shown in FIG. 18, and each word line WL is connected to a word line driving circuit not shown in FIG. 18. The sets of first control electrodes $20_i$ (i=1, ...) and the sets of second control electrodes $30_i$ (i=1, ...) are connected to different driving circuits, respectively, e.g., the driving circuit 50 and the driving circuit 52 shown in FIG. 1. The common upper electrode 140 is connected to an upper electrode driving circuit not shown in FIG. 18.

In the magnetic memory thus constituted, the shift operation of the magnetic film 10A of each memory cell column 2 is performed using the electric field generated by the difference in potential between the upper electrode 140 and the first control electrodes $20_i$ (i=1, ...) and the second control electrodes $30_i$ (i=1, ...). In this case, the shift operation is performed on all of the memory cell columns 2 in the same column, and the access is made to a plurality of cells via each bit line.

The write and read operations are performed in the following manner. First, a voltage is applied to the gate (word line) of the selection transistor connected to the memory cell column 2 for performing the write or read operation to turn it on. Subsequently, a current is caused to flow through the current path of the upper electrode 140 the magnetic film 10A, the MTJ element 40, the contact plug 120, the source and drain region 112, the element region 116, the source and drain region 114, the contact plug 124, and the bit line BL. Depending on the direction of magnetization to be written to the magnetic film 10A, the current is caused to flow in the opposite direction through the current path.

The same effect as the effect of the fourth embodiment can be obtained by the magnetic memory of the fifth embodiment.

(Modification)

Figure 19:
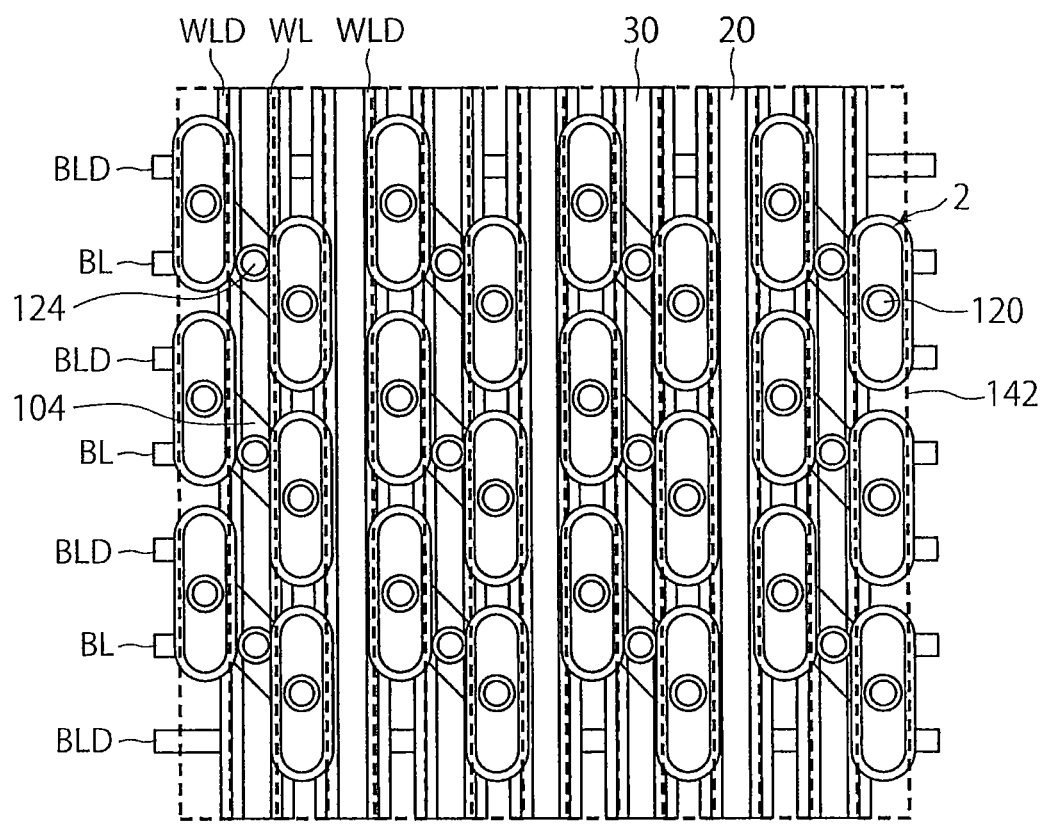
FIG. 19 is a top view of a shift register type magnetic memory according to a modification of the fifth embodiment.

A shift register type magnetic memory according to a modification of the fifth embodiment will be described with reference to FIG. 19, which is a top view of the magnetic memory according to the modification. The magnetic memory of this modification has a structure obtained by dividing the upper electrode 140 of the magnetic memory of the fifth embodiment so that each divided part serves as a common upper electrode 142 for the sets of memory cell columns arranged in the same column direction. By having a divided upper electrode 142, it is possible to reduce the leakage current in the read or write operation.

In this modification, a dummy bit line BLD can be provided between bit lines BL of the magnetic memory according to the fifth embodiment. In this case, it is possible to improve the controllability of the lithography or the controllability of processing (patterning) in manufacturing the magnetic memory.

The same effect as the effect of the fourth embodiment can be obtained by the magnetic memory of the modification of the fifth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, although magnetic memories are mainly described in the descriptions of the embodiments, the present invention is not limited thereto, but can be applied to any device other than memories, if such a device uses a shift register.

The invention claimed is:

1. A shift register comprising:
    at least one magnetic nanowire;
    a first control electrode group and a second control electrode group arranged with the magnetic nanowire being sandwiched therebetween, the first control electrode group including a plurality of first control electrodes arranged to be spaced apart from each other along a direction in which the magnetic nanowire extends, the second control electrode group including a plurality of second control electrodes arranged to be spaced apart from each other to correspond to the plurality of first control electrodes along the direction in which the magnetic nanowire extends, and the second control electrode group being shifted relative to the first control electrode group in the direction in which the magnetic nanowire extends;
    a first driving unit for driving the first control electrode group; and
    a second driving unit for driving the second control electrode group,
    the first driving unit and the second driving unit alternately applying voltage.

2. The shift register according to claim 1, wherein the magnetic nanowire includes a first region in which none of the first and the second control electrodes is provided, a second region in which the first control electrode is provided but the second control electrode is not provided, a third region in which both the first and the second control electrodes are provided, and a fourth region in which the second control electrode is provided but the first control electrode is not provided, the first region, the second region, the third region, and the fourth region being arranged in the direction in which the magnetic nanowire extends.

3. The shift register according to claim 1, wherein an insulating film is provided between each of the first and the second control electrodes and the magnetic nanowire.

4. The shift register according to claim 1, wherein the first driving unit drives the first control electrodes to have an identical potential, and the second driving unit drives the second control electrodes to have an identical potential.

5. The shift register according to claim 2, wherein a width of the magnetic nanowire in the first region differs from a width thereof in the second region, the width of the second region of the magnetic nanowire differs from a width thereof in the third region, the width of the magnetic nanowire in the third region differs from a width thereof in the fourth region, and the width of the magnetic nanowire in the fourth region differs from the width thereof in the first region.

6. The shift register according to claim 1, wherein the magnetic nanowire has a shape in which one end thereof is connected to the other end.

7. The shift register according to claim 1, wherein the at least one magnetic nanowire has a stacked structure in which more than one magnetic nanowires are stacked with an insulating film being sandwiched between adjacent magnetic nanowires, each of the magnetic nanowires having a first portion including an end of the magnetic nanowire and a second portion that differs from the first portion, the first portion being inclined relative to the second portion.

8. The shift register according to claim 1, further comprising a writing unit for writing magnetization information to the magnetic nanowire, and a reading unit for reading magnetization information from the magnetic nanowire, the writing unit and the reading unit including a common MTJ element.

9. A shift register type magnetic memory comprising at least one memory cell column, the at least one memory cell column including:
    a magnetic film including a tube type main body and a bottom portion connecting to the main body;
    a first control electrode group including a plurality of first control electrodes, which are provided to one of opposing sides of the main body, and are arranged along a direction of a long axis of the main body so as to be spaced apart from each other; and
    a second control electrode group including a plurality of second control electrodes, which are provided to the other of the opposing sides of the main body, and are arranged along the direction of the long axis so as to be spaced apart from each other, the second control electrode group being shifted relative to the first control electrode group in the direction of the long axis of the main body; and
    an MTJ element for reading magnetization information from the magnetic film and for writing magnetization information to the magnetic film.

10. The shift register type magnetic memory according to claim 9, further comprising a nonmagnetic conductive film embedded in the tube of the magnetic film.

11. The shift register type magnetic memory according to claim 9, further comprising:
    a first insulating film provided between the magnetic film and the first control electrodes; and
    a second insulating film provided between the magnetic film and the second control electrodes,
    one of the first insulating film and the second insulating film being formed of a material identical with a material of a tunnel insulating layer of the MTJ element.

12. The shift register type magnetic memory according to claim 9, wherein in a direction in which the first control electrode group and the second control electrode group are opposed to each other, a distance between the first control electrode group and the second control electrode group is shorter than an outer diameter of the main body.

13. The shift register type magnetic memory according to claim 9, wherein in a section of the main body in a plane perpendicular to a long axis of the main body, a length in a direction in which the first control electrode group and the second control electrode group are opposed to each other is shorter than a length in a direction which is perpendicular to the direction in which the first control electrode group and the second control electrode group are opposed to each other.

14. The shift register type magnetic memory according to claim 9, wherein in a direction of a long axis of the magnetic film, the magnetic film includes a first region in which none of the first and the second control electrodes is provided, a second region in which the first control electrode is provided but the second control electrode is not provided, a third region in which both the first and the second control electrodes are provided, and a fourth region in which the second control electrode is provided but the first control electrode is not provided, and wherein an outer diameter of the magnetic film differs between the first region and the second region, the outer diameter of the magnetic film differs between the second region and the third region, the outer diameter of the magnetic film differs between the third region and the fourth region, and the outer diameter differs between the fourth region and the first region.

15. The shift register type magnetic memory according to claim 9, further comprising:
   a first driving unit for driving the first control electrode group; and
   a second driving unit for driving the second control electrode group,
      wherein the first driving unit and the second driving unit alternately apply voltage.

16. The shift register type magnetic memory according to claim 15, wherein the first driving unit drives the first control electrodes to have an identical potential, and the second driving unit drives the second control electrodes to have an identical potential.

17. The shift register type magnetic memory according to claim 9, wherein the at least one memory cell column includes a first memory cell column and a second memory cell column, and wherein the first memory cell column and the second memory cell column share at least one of the first control electrode group and the second control electrode group,
   the shift register type magnetic memory further comprising:
      a first selection transistor for selecting the first memory cell column;
      a second selection transistor for selecting the second memory cell column; and
      an upper electrode arranged above the first memory cell column and the second memory cell column, and electrically connected to the magnetic film.

18. The shift register type magnetic memory according to claim 17, wherein the first selection transistor and the second selection transistor are arranged below the first memory cell column and the second memory cell column.

19. The shift register type magnetic memory according to claim 17, wherein the upper electrode includes a first upper electrode electrically connected to the first memory cell column and a second upper electrode electrically connected to the second memory cell column.

20. The shift register type magnetic memory according to claim 9, wherein the first control electrode group and the second control electrode group extend in a direction perpendicular to a direction in which the first control electrode group and the second control electrode group are opposed to each other, and wherein a plurality of the memory cell columns share the first control electrode group and the second control electrode group.

* * * * *